US011840158B2

(12) United States Patent
Nubbe

(10) Patent No.: US 11,840,158 B2
(45) Date of Patent: *Dec. 12, 2023

(54) SYSTEMS AND METHODS FOR BATTERY CAPACITY MANAGEMENT IN A FLEET OF UAVS

(71) Applicant: Wing Aviation LLC, Mountain View, CA (US)

(72) Inventor: Matthew Nubbe, Sunnyvale, CA (US)

(73) Assignee: Wing Aviation LLC, Palo Alto, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/068,862

(22) Filed: Dec. 20, 2022

(65) Prior Publication Data

US 2023/0294552 A1  Sep. 21, 2023

Related U.S. Application Data

(63) Continuation of application No. 17/083,293, filed on Oct. 29, 2020, now Pat. No. 11,565,605.

(51) Int. Cl.
*B60L 58/13* (2019.01)
*G01R 31/387* (2019.01)
(Continued)

(52) U.S. Cl.
CPC .............. *B60L 58/13* (2019.02); *B60L 58/16* (2019.02); *B64C 39/024* (2013.01);
(Continued)

(58) Field of Classification Search
CPC ........ B60L 58/13; B60L 58/16; B64C 39/024; G01R 31/387; G01R 31/392; B64U 50/19;
(Continued)

(56) References Cited

U.S. PATENT DOCUMENTS 7,880,439 B2 * 2/2011 Miki ..................... H02J 7/0049
320/132
8,212,526 B2 * 7/2012 Oh .................... H02J 7/007182
320/132
(Continued)

FOREIGN PATENT DOCUMENTS

CN 103221835 B * 7/2015 ........... G01R 31/392
CN 106685002    5/2017
(Continued)

OTHER PUBLICATIONS

International Searching Authority, International Search Report and Written Opinion dated Jan. 19, 2022, issued in connection with International Patent Application No. PCT/US2021/071632, filed Sep. 28, 2021, 9 pages.
(Continued)

*Primary Examiner* — M Baye Diao
(74) *Attorney, Agent, or Firm* — McDonnell Boehnen Hulbert & Berghoff LLP

(57) ABSTRACT

A method includes determining a threshold capacity associated with at least a first unmanned aerial vehicle (UAV) and a second UAV. The method includes initially setting a target charge voltage of a first battery of the first UAV to less than a full charge voltage to limit a state of charge of the first battery based on the threshold capacity. The method includes, over a lifetime of the first battery of the first UAV, periodically comparing a full charge capacity of the first battery to the threshold capacity. The method includes, based on the comparing, periodically adjusting the target charge voltage of the first battery, such that, as the full charge capacity of the first battery decreases with age, the target charge voltage increases towards the full charge voltage of the first battery.

20 Claims, 13 Drawing Sheets

(51) Int. Cl.
  *B64C 39/02* (2023.01)
  *G01R 31/392* (2019.01)
  *B60L 58/16* (2019.01)
  *B64U 50/19* (2023.01)
  *B64U 50/34* (2023.01)

(52) U.S. Cl.
  CPC ......... *G01R 31/387* (2019.01); *G01R 31/392* (2019.01); *B64U 50/19* (2023.01); *B64U 50/34* (2023.01); *B64U 2201/10* (2023.01); *H01M 2220/20* (2013.01)

(58) Field of Classification Search
  CPC ............... B64U 50/34; B64U 2201/10; H01M 2220/20
  USPC .......................................................... 320/134
  See application file for complete search history.

(56) References Cited

U.S. PATENT DOCUMENTS

| | | | |
|---|---|---|---|
| 8,849,598 B2* | 9/2014 | Mingant | G01R 31/367 324/426 |
| 9,197,091 B2 | 11/2015 | Kishiyama et al. | |
| 9,242,571 B2 | 1/2016 | Fukui et al. | |
| 9,376,208 B1 | 6/2016 | Gentry | |
| 9,440,550 B2 | 9/2016 | Jones | |
| 9,527,392 B2* | 12/2016 | Peverill | G05D 1/101 |
| 9,550,429 B2 | 1/2017 | Madurai-Kumar et al. | |
| 9,643,510 B2 | 5/2017 | Liu | |
| 9,728,995 B2 | 8/2017 | Matsumura et al. | |
| 10,026,998 B2* | 7/2018 | Li | B60L 3/12 |
| 10,110,053 B2 | 10/2018 | Brackx et al. | |
| 10,236,802 B2* | 3/2019 | Botts | H02J 7/1423 |
| 10,310,501 B2 | 6/2019 | Greenberger et al. | |
| 10,345,383 B2* | 7/2019 | Mullen | G01R 31/382 |
| 10,447,055 B1 | 10/2019 | Berkowitz et al. | |
| 10,525,832 B2 | 1/2020 | Zhao | |
| 10,580,311 B2 | 3/2020 | Schmalzried et al. | |
| 10,597,157 B1 | 3/2020 | Schmalzried et al. | |
| 10,630,082 B1 | 4/2020 | Gu et al. | |
| 10,663,529 B1 | 5/2020 | Bolotski et al. | |
| 10,671,064 B2 | 6/2020 | Schmalrzied et al. | |
| 11,001,386 B2* | 5/2021 | Kandasamy | B64C 39/024 |
| 2012/0133337 A1 | 5/2012 | Rombouts et al. | |
| 2015/0158392 A1 | 6/2015 | Zhao | |
| 2017/0072812 A1 | 3/2017 | Von Novak et al. | |
| 2017/0117723 A1 | 4/2017 | Rebele et al. | |
| 2017/0163060 A1 | 6/2017 | Zheng et al. | |
| 2017/0352926 A1* | 12/2017 | Kanomata | H01M 10/42 |
| 2018/0145526 A1* | 5/2018 | Ravi | H02J 7/0069 |
| 2018/0375344 A1 | 12/2018 | Matsumura et al. | |
| 2019/0126769 A1 | 5/2019 | Schmalzried et al. | |

FOREIGN PATENT DOCUMENTS

| | | |
|---|---|---|
| CN | 107554349 | 1/2018 |
| CN | 107681737 | 2/2018 |
| CN | 109917810 | 6/2019 |
| CN | 110556903 | 12/2019 |
| WO | 2016/019562 | 2/2016 |
| WO | 2017/198696 | 11/2017 |
| WO | 2019/218097 | 11/2019 |

OTHER PUBLICATIONS

Kim et al., "Hydrone: Reconfigurable Energy Storage for UAV Applications," IEEE Transactions on Computer-Aided Design of Integrated Circuits and Systems, Nov. 2020, pp. 3686-3697, vol. 39, No. 11.

Li et al., "Energy-Controlled Optimization Algorithm for Rechargeable Unmanned Aerial Vehicle Network," 2017 12th IEEE Conference on Industrial Electronics and Applications (ICIEA), 2017, 6 pages.

Park et al., "Battery Assignment and Scheduling for Drone Delivery Businesses," 2017 IEEE/ACM International Symposium on Low Power Electronics and Design (ISLPED), Jul. 2017, 6 pages.

Saha et al., "Battery health management system for electric UAVs," 2011 Aerospace Conference, 2011, 9 pages.

Valenti et al., "Mission Health Management for 24/7 Persistent Surveillance Operations," 2017 IEEE/ACM International Symposium on Low Power Electronics and Design (ISLPED), Jun. 15, 2012 18 pages.

* cited by examiner

SYSTEMS AND METHODS FOR BATTERY CAPACITY MANAGEMENT IN A FLEET OF UAVS

CROSS-REFERENCE TO RELATED APPLICATIONS

This application is a continuation of and claims priority to U.S. patent application Ser. No. 17/083,293, filed Oct. 29, 2020, and titled "Systems and Methods for Battery Capacity Management in a Fleet of UAVs," which is hereby incorporated by reference as if fully set forth in this description.

BACKGROUND

An unmanned vehicle, which may also be referred to as an autonomous vehicle, is a vehicle capable of travel without a physically-present human operator. An unmanned vehicle may operate in a remote-control mode, in an autonomous mode, or in a partially autonomous mode.

When an unmanned vehicle operates in a remote-control mode, a pilot or driver that is at a remote location can control the unmanned vehicle via commands that are sent to the unmanned vehicle via a wireless link. When the unmanned vehicle operates in autonomous mode, the unmanned vehicle typically moves based on pre-programmed navigation waypoints, dynamic automation systems, or a combination of these. Further, some unmanned vehicles can operate in both a remote-control mode and an autonomous mode, and in some instances may do so simultaneously. For instance, a remote pilot or driver may wish to leave navigation to an autonomous system while manually performing another task, such as operating a mechanical system for picking up objects, as an example.

Various types of unmanned vehicles exist for various different environments. For instance, unmanned vehicles exist for operation in the air, on the ground, underwater, and in space. Examples include quad-copters and tail-sitter UAVs, among others. Unmanned vehicles also exist for hybrid operations in which multi-environment operation is possible. Examples of hybrid unmanned vehicles include an amphibious craft that is capable of operation on land as well as on water or a floatplane that is capable of landing on water as well as on land. Other examples are also possible.

SUMMARY

Examples disclosed herein provide a method, a system, and a non-transitory computer-readable medium for managing battery capacities in a fleet of aerial vehicles, such as a fleet of autonomous or unmanned aerial vehicles (UAVs). The battery capacities may be compared with a threshold capacity associated with one or more characteristics of the fleet or one or more operations to be carried out by the fleet, and a battery of each UAV can be charged based on comparing its capacity to the threshold capacity. These examples may allow for consistent and reliable performance of flight operations of the fleet of UAVs.

In an embodiment, a method is provided. The method includes determining a threshold capacity associated with at least a first unmanned aerial vehicle (UAV) and a second UAV. The method includes initially setting a target charge voltage of a first battery of the first UAV to less than a full charge voltage to limit a state of charge of the first battery based on the threshold capacity. The method includes, over a lifetime of the first battery of the first UAV, periodically comparing a full charge capacity of the first battery to the threshold capacity. The method includes, based on the comparing, periodically adjusting the target charge voltage of the first battery, such that, as the full charge capacity of the first battery decreases with age, the target charge voltage increases towards the full charge voltage of the first battery.

In another embodiment, a system is provided. The system includes a first unmanned aerial vehicle (UAV), a second UAV, one or more processors, a non-transitory computer readable medium, and program instructions stored on the non-transitory computer readable medium. The program instructions are and executable by the one or more processors to determine a threshold capacity associated with at least the first UAV and the second UAV. The program instructions are and executable by the one or more processors to initially set a target charge voltage of a first battery of the first UAV to less than a full charge voltage to limit a state of charge of the first battery based on the threshold capacity. The program instructions are and executable by the one or more processors to, over a lifetime of the first battery of the first UAV, periodically compare a full charge capacity of the first battery to the threshold capacity. The program instructions are and executable by the one or more processors to, based on the comparing, periodically adjust the target charge voltage of the first battery, such that, as the full charge capacity of the first battery decreases with age, the target charge voltage increases towards the full charge voltage of the first battery.

In a further embodiment, a non-transitory computer readable medium is provided. The non-transitory computer readable medium has stored therein instructions executable by one or more processors to cause a computing system to perform functions. The functions include determining a threshold capacity associated with at least a first unmanned aerial vehicle (UAV) and a second UAV. The functions include initially setting a target charge voltage of a first battery of the first UAV to less than a full charge voltage to limit a state of charge of the first battery based on the threshold capacity. The functions include, over a lifetime of the first battery of the first UAV, periodically comparing a full charge capacity of the first battery to the threshold capacity. The functions include, based on the comparing, periodically adjusting the target charge voltage of the first battery, such that, as the full charge capacity of the first battery decreases with age, the target charge voltage increases towards the full charge voltage of the first battery.

In another embodiment, a system is provided. The system includes means for determining a threshold capacity associated with at least a first unmanned aerial vehicle (UAV) and a second UAV. The system includes means for initially setting a target charge voltage of a first battery of the first UAV to less than a full charge voltage to limit a state of charge of the first battery based on the threshold capacity. The system includes means for, over a lifetime of the first battery of the first UAV, periodically comparing a full charge capacity of the first battery to the threshold capacity. The system includes means for, based on the comparing, periodically adjusting the target charge voltage of the first battery, such that, as the full charge capacity of the first battery decreases with age, the target charge voltage increases towards the full charge voltage of the first battery.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this docu-

DETAILED DESCRIPTION

Figure 1A:
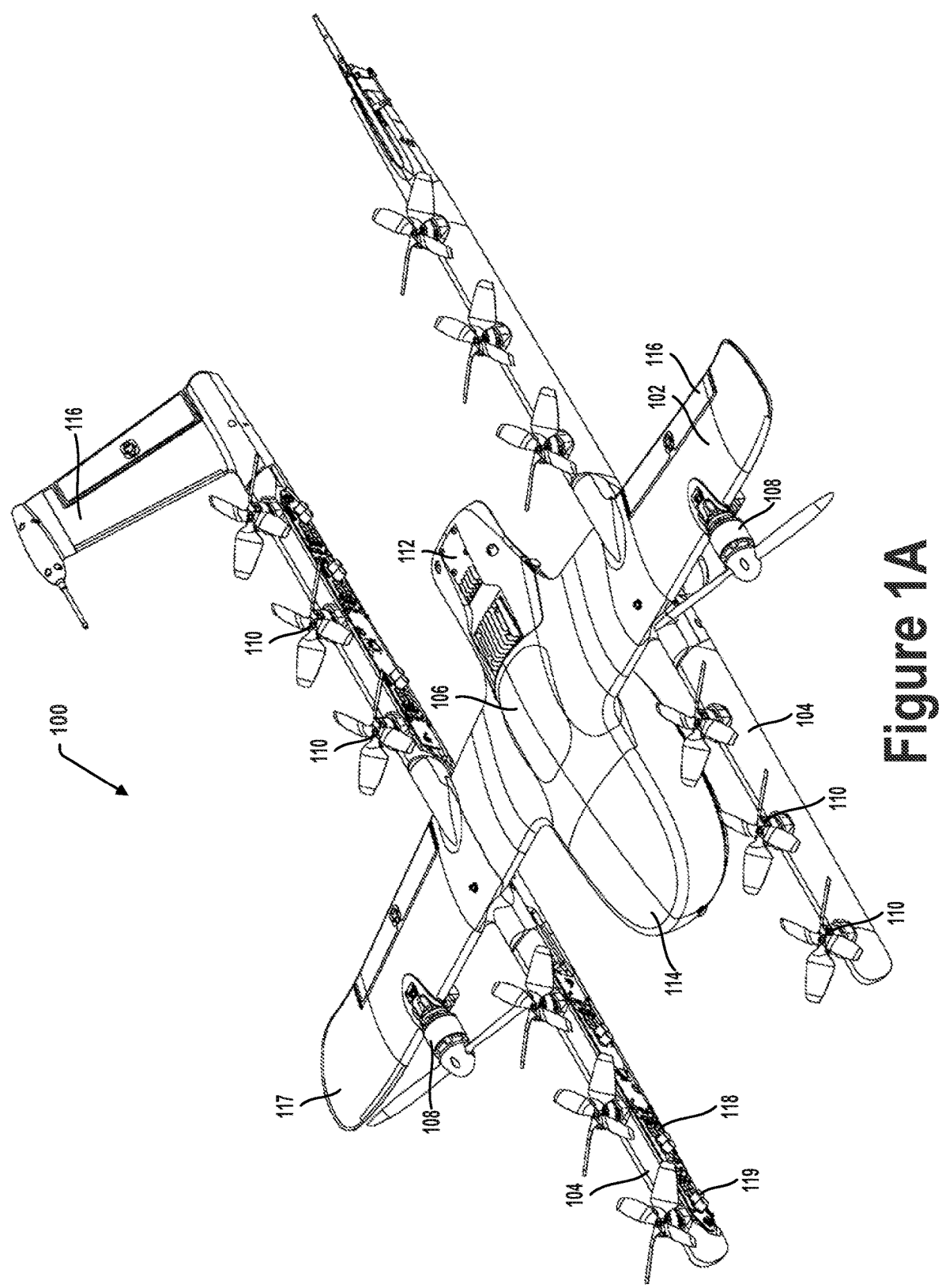
FIG. 1A is an illustration of an unmanned aerial vehicle, in accordance with example embodiments.

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features unless indicated as such. Other embodiments can be utilized, and other changes can be made, without departing from the scope of the subject matter presented herein.

Thus, the example embodiments described herein are not meant to be limiting. It will be readily understood that the aspects of the present disclosure, as generally described herein, and illustrated in the figures, can be arranged, substituted, combined, separated, and designed in a wide variety of different configurations.

Throughout this description, the articles "a" or "an" are used to introduce elements of the example embodiments. Any reference to "a" or "an" refers to "at least one," and any reference to "the" refers to "the at least one," unless otherwise specified, or unless the context clearly dictates otherwise. The intent of using the conjunction "or" within a described list of at least two terms is to indicate any of the listed terms or any combination of the listed terms.

The use of ordinal numbers such as "first," "second," "third" and so on is to distinguish respective elements rather than to denote a particular order of those elements. For the purposes of this description, the terms "multiple" and "a plurality of" refer to "two or more" or "more than one."

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment. In the figures, similar symbols typically identify similar components, unless context dictates otherwise. Further, unless otherwise noted, figures are not drawn to scale and are used for illustrative purposes only. Moreover, the figures are representational only and not all components are shown. For example, additional structural or restraining components might not be shown.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

I. OVERVIEW

Systems such as unmanned aerial vehicles (UAVs), or more generally, aerial vehicles, may operate in a fleet that includes a plurality of UAVs that are configured to carry out flight operations. The UAVs in a fleet may each include a battery to power the UAV when carrying out a flight operation, such as a package delivery. Different UAVs in the fleet may perform different operations at different times, may begin operating at different times, or have batteries with different characteristics. Accordingly, it may be difficult to assign a given UAV in the fleet to a given flight operation.

As a result, it may be desirable to align one or more characteristics of batteries of UAVs in a fleet. This may advantageously allow for more predictable and reliable performance of flight operations carried out by the fleet of UAVs.

Example embodiments may include or otherwise relate to managing batteries of one or more unmanned aerial vehicles (UAVs). In particular, examples involve managing battery capacities for a fleet of UAVs. As used herein in the context of a battery, the term "capacity" refers to an amount of energy stored by the battery, and may be represented in terms of power times unit time (e.g., Watt hours).

Battery capacities decrease with use and time, and may decrease more quickly when consistently charged to a maximum capacity. Other factors can impact this decline in battery capacity, such as frequency of use of a battery and charge levels of the battery when recharging. In the context of a plurality of battery-powered devices configured to execute similar tasks (e.g., a fleet of battery-powered UAVs), each battery will typically decline at a different rate, which results in some devices having more capacity than others. Assigning operational tasks to a given device may thus be result in inconsistent performance.

For example, in the context of a fleet of UAVs, flight planning may be complicated by UAVs with lower capacities being unable to fly a desired distance, while others may be capable of performing this task. When scheduling tasks based on which UAV can fly a certain distance, newer batteries may more rapidly degrade due to being consistently charged to a full charge capacity, and older batteries may become obsolete in a shorter timeframe. Alternatively, more sophisticated planning and range partitioning may be required. In contexts in which such planning is impracticable, such as when the flight path must be randomly assigned to an aircraft, it may be difficult to prevent relatively quick decline in battery performance.

Within examples, a capacity of a battery of a UAV can be adjusted to a common capacity shared by a plurality of UAVs. For example, a threshold capacity can be determined that is associated with the fleet of UAVs, and each battery can be individually charged in order to meet or exceed the threshold capacity. Because each battery may have a different capacity and different associated charging characteristics, this may involve altering a target charge voltage of one or more batteries of UAVs to adjust the capacity of each battery to align with the threshold capacity. In this manner, a system can consistently and reliably assign tasks to UAVs based on each UAV having the same predetermined capacity. Further, by effectively reducing the capacity of at least some UAV batteries to a level below the full charge capacity, the system may reduce the rate of degradation of batteries in the fleet. Put another way, managing battery capacities of each UAV in accordance with the systems and methods described herein may extend each battery lifetime in the fleet of UAVs. As used herein, the term "threshold capacity" refers to a target energy level for use in charging batteries in a fleet of UAVs.

In some scenarios, it may beneficial from an operational standpoint to cycle out batteries after they reach a certain age. For example, more effective batteries can be developed as the batteries age, and thus it may be desirable to cycle some batteries out of the fleet after they reach a certain period of time (e.g., at the end of a battery's expected useful lifetime). As a battery ages, its respective charge voltage may be adjusted towards a maximum charge level to maintain the common battery capacity of the fleet, leading to more rapid degradation of the battery and allowing it to cycle out of the fleet more quickly. Thus, in some contexts, a threshold capacity used for managing the batteries in the fleet may be determined based on a desired battery lifetime (e.g., a desired number of charge/discharge cycles), and the threshold capacity can be adjusted for at least some batteries if the desired lifetime changes.

In alternative contexts, a fleet of UAVs may include a plurality of classes of UAVs associated with different tasks or flight radii. For example, newer batteries may be part of a first class associated with longer flights, and nominally degraded batteries may be assigned to a second class associated with shorter flights. The first class and second class may each have an associated battery capacity.

Within examples, the system may include a computing device that serves as a controller of the fleet of UAVs. The computing device may communicate with the UAVs and/or one or more chargers of the UAVs to determine a full charge capacity or a State of Health of each battery, to determine desired target charge voltages of the batteries, and to instruct the one or more chargers to charge the UAVs accordingly. As used herein in the context of batteries, the term "State of Health" refers to a performance of the battery relative to its specifications. For example, this may relate to age, number of charge-discharge cycles, degraded capacity, self-discharge characteristics, or other factors that relate to battery performance.

Reference will now be made in detail to various embodiments, examples of which are illustrated in the accompanying drawings. In the following detailed description, numerous specific details are set forth in order to provide a thorough understanding of the present disclosure and the described embodiments. However, the present disclosure may be practiced without these specific details. In other instances, well-known methods, procedures, and components, and circuits have not been described in detail so as not to unnecessarily obscure aspects of the embodiments.

II. EXAMPLE UNMANNED VEHICLES

Herein, the terms "unmanned aerial system" and "UAV" refer to any autonomous or semi-autonomous vehicle that is capable of performing some functions without a physically present human pilot. A UAV can take various forms. For example, a UAV may take the form of a fixed-wing aircraft, a glider aircraft, a tail-sitter aircraft, a jet aircraft, a ducted fan aircraft, a lighter-than-air dirigible such as a blimp or steerable balloon, a rotorcraft such as a helicopter or multicopter, and/or an ornithopter, among other possibilities. Further, the terms "drone," "unmanned aerial vehicle system" (UAVS), or "unmanned aerial vehicle" may also be used to refer to a UAV.

FIG. 1A is an isometric view of an example UAV 100. UAV 100 includes wings 102, booms 104, and a fuselage 106. Wings 102 may be stationary and may generate lift based on the wing shape and the UAV's forward airspeed. For instance, the two wings 102 may have an airfoil-shaped cross section to produce an aerodynamic force on UAV 100. In some embodiments, wing 102 may carry horizontal propulsion units 108, and booms 104 may carry vertical propulsion units 110. In operation, power for the propulsion units may be provided from a battery compartment 112 of fuselage 106. In some embodiments, fuselage 106 also includes an avionics compartment 114, an additional battery compartment (not shown) and/or a delivery unit (not shown, e.g., a winch system) for handling the payload. In some embodiments, fuselage 106 is modular, and two or more compartments (e.g., battery compartment 112, avionics compartment 114, other payload and delivery compartments) are detachable from each other and securable to each other (e.g., mechanically, magnetically, or otherwise) to contiguously form at least a portion of fuselage 106.

In some embodiments, booms 104 terminate in rudders 116 for improved yaw control of UAV 100. Further, wings 102 may terminate in wing tips 117 for improved control of lift of the UAV.

In the illustrated configuration, UAV 100 includes a structural frame. The structural frame may be referred to as a "structural H-frame" or an "H-frame" (not shown) of the UAV. The H-frame may include, within wings 102, a wing spar (not shown) and, within booms 104, boom carriers (not shown). In some embodiments the wing spar and the boom carriers may be made of carbon fiber, hard plastic, aluminum, light metal alloys, or other materials. The wing spar and the boom carriers may be connected with clamps. The wing spar may include pre-drilled holes for horizontal propulsion units 108, and the boom carriers may include pre-drilled holes for vertical propulsion units 110.

In some embodiments, fuselage 106 may be removably attached to the H-frame (e.g., attached to the wing spar by clamps, configured with grooves, protrusions or other features to mate with corresponding H-frame features, etc.). In other embodiments, fuselage 106 similarly may be removably attached to wings 102. The removable attachment of fuselage 106 may improve quality and or modularity of UAV 100. For example, electrical/mechanical components and/or subsystems of fuselage 106 may be tested separately from, and before being attached to, the H-frame. Similarly, printed circuit boards (PCBs) 118 may be tested separately from, and before being attached to, the boom carriers, therefore eliminating defective parts/subassemblies prior to completing the UAV. For example, components of fuselage 106 (e.g., avionics, battery unit, delivery units, an additional battery compartment, etc.) may be electrically tested before fuselage 106 is mounted to the H-frame. Furthermore, the motors and the electronics of PCBs 118 may also be electrically tested before the final assembly. Generally, the identification of the defective parts and subassemblies early in the assembly process lowers the overall cost and lead time of the UAV. Furthermore, different types/models of fuselage 106 may be attached to the H-frame, therefore improving the modularity of the design. Such modularity allows these various parts of UAV 100 to be upgraded without a substantial overhaul to the manufacturing process.

In some embodiments, a wing shell and boom shells may be attached to the H-frame by adhesive elements (e.g., adhesive tape, double-sided adhesive tape, glue, etc.). Therefore, multiple shells may be attached to the H-frame instead of having a monolithic body sprayed onto the H-frame. In some embodiments, the presence of the multiple shells reduces the stresses induced by the coefficient of thermal expansion of the structural frame of the UAV. As a result, the UAV may have better dimensional accuracy and/or improved reliability.

Moreover, in at least some embodiments, the same H-frame may be used with the wing shell and/or boom shells having different size and/or design, therefore improving the modularity and versatility of the UAV designs. The wing shell and/or the boom shells may be made of relatively light polymers (e.g., closed cell foam) covered by the harder, but relatively thin, plastic skins.

The power and/or control signals from fuselage 106 may be routed to PCBs 118 through cables running through fuselage 106, wings 102, and booms 104. In the illustrated embodiment, UAV 100 has four PCBs, but other numbers of PCBs are also possible. For example, UAV 100 may include two PCBs, one per the boom. The PCBs carry electronic components 119 including, for example, power converters, controllers, memory, passive components, etc. In operation, propulsion units 108 and 110 of UAV 100 are electrically connected to the PCBs.

Many variations on the illustrated UAV are possible. For instance, fixed-wing UAVs may include more or fewer rotor units (vertical or horizontal), and/or may utilize a ducted fan or multiple ducted fans for propulsion. Further, UAVs with more wings (e.g., an "x-wing" configuration with four wings), are also possible. Although FIG. 1 illustrates two wings 102, two booms 104, two horizontal propulsion units 108, and six vertical propulsion units 110 per boom 104, it should be appreciated that other variants of UAV 100 may be implemented with more or less of these components. For example, UAV 100 may include four wings 102, four booms 104, and more or less propulsion units (horizontal or vertical).

Figure 1B:
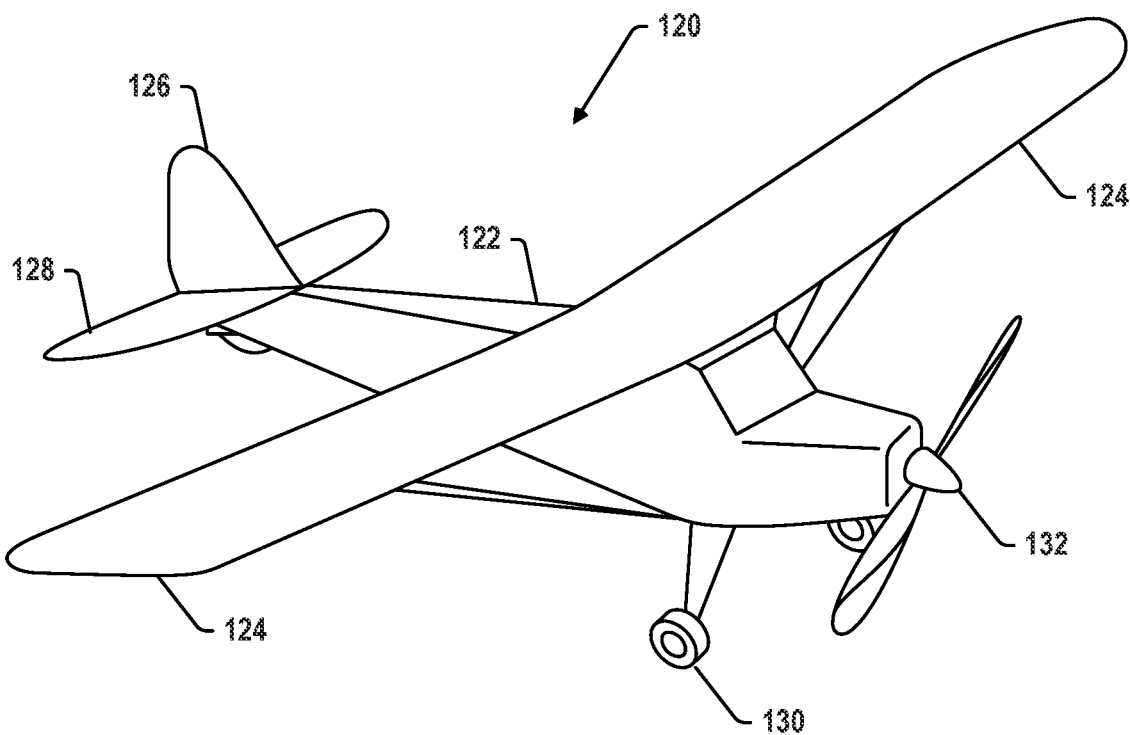
FIG. 1B is a simplified illustration of an unmanned aerial vehicle, in accordance with example embodiments.

Similarly, FIG. 1B shows another example of a fixed-wing UAV 120. Fixed-wing UAV 120 includes fuselage 122, two wings 124 with an airfoil-shaped cross section to provide lift for UAV 120, vertical stabilizer 126 (or fin) to stabilize the plane's yaw (turn left or right), horizontal stabilizer 128 (also referred to as an elevator or tailplane) to stabilize pitch (tilt up or down), landing gear 130, and propulsion unit 132, which can include a motor, shaft, and propeller.

Figure 1C:
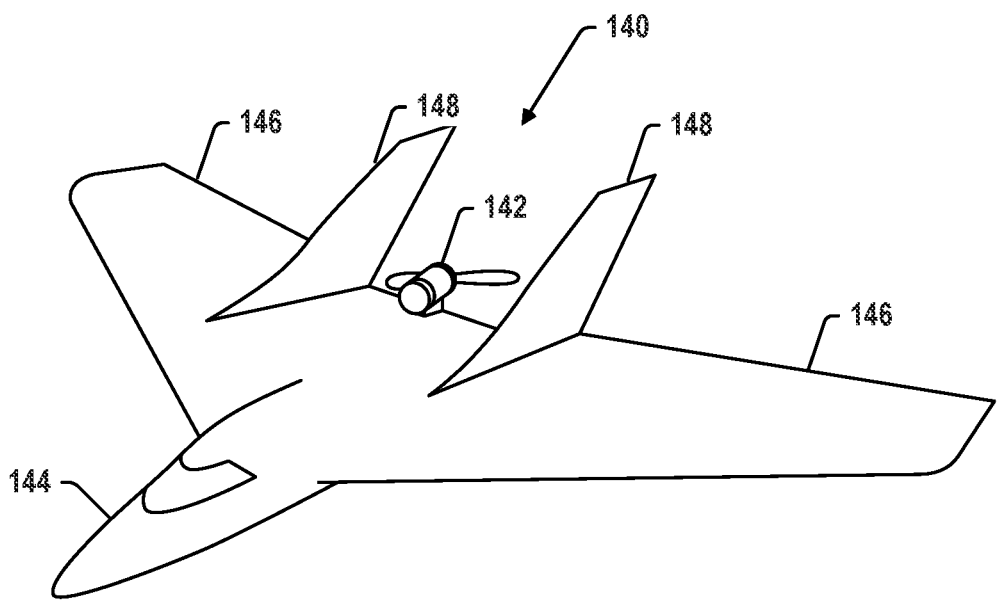
FIG. 1C is a simplified illustration of an unmanned aerial vehicle, in accordance with example embodiments.

FIG. 1C shows an example of UAV 140 with a propeller in a pusher configuration. The term "pusher" refers to the fact that propulsion unit 142 is mounted at the back of UAV 140 and "pushes" the vehicle forward, in contrast to the propulsion unit 142 being mounted at the front of UAV 140. Similar to the description provided for FIGS. 1A and 1B, FIG. 1C depicts common structures used in a pusher plane, including fuselage 144, two wings 146, vertical stabilizers 148, and propulsion unit 142, which can include a motor, shaft, and propeller.

Figure 1D:
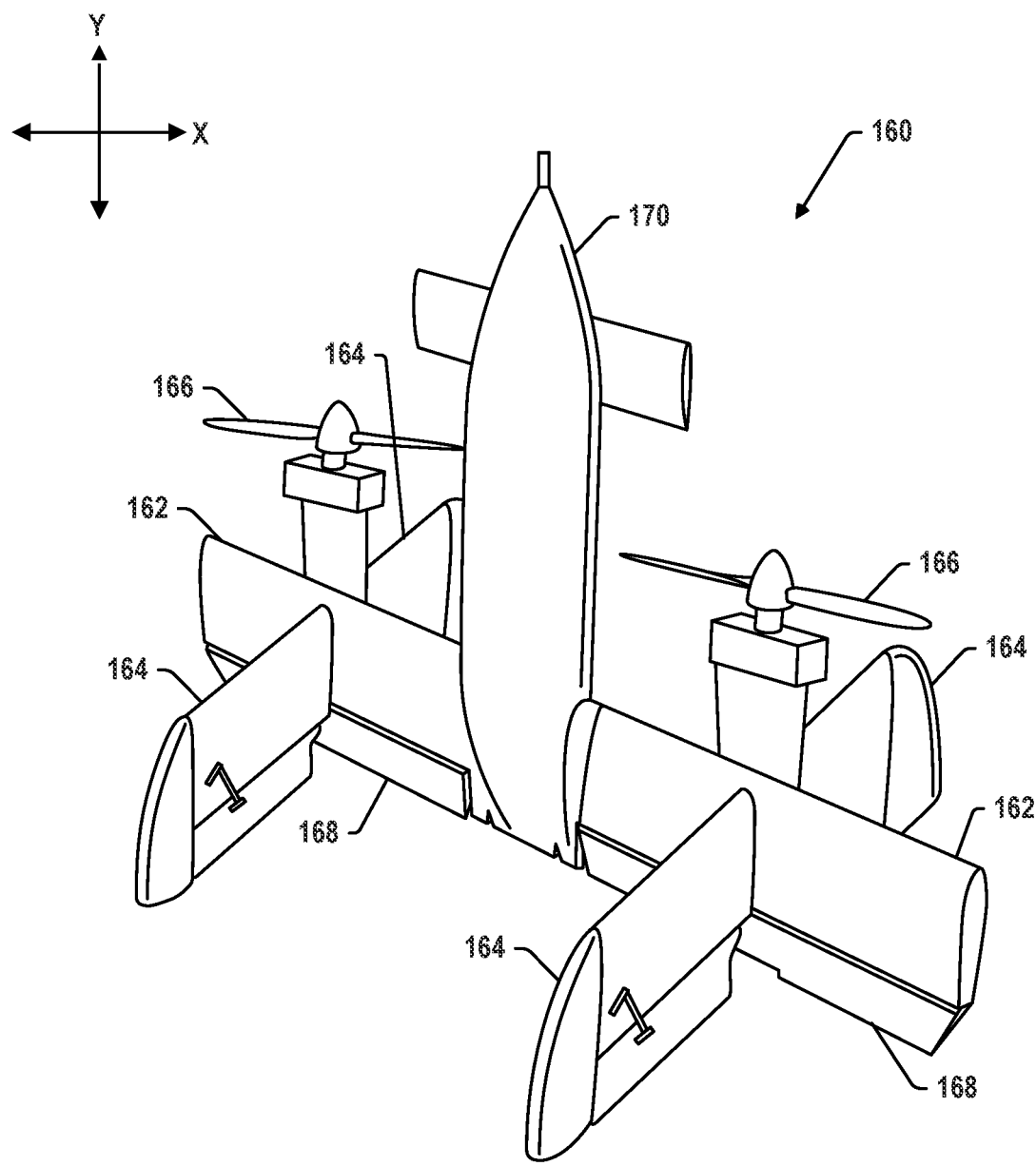
FIG. 1D is a simplified illustration of an unmanned aerial vehicle, in accordance with example embodiments.

FIG. 1D shows an example tail-sitter UAV 160. In the illustrated example, tail-sitter UAV 160 has fixed wings 162 to provide lift and allow UAV 160 to glide horizontally (e.g., along the x-axis, in a position that is approximately perpendicular to the position shown in FIG. 1D). However, fixed wings 162 also allow tail-sitter UAV 160 to take off and land vertically on its own.

For example, at a launch site, tail-sitter UAV 160 may be positioned vertically (as shown) with fins 164 and/or wings 162 resting on the ground and stabilizing UAV 160 in the vertical position. Tail-sitter UAV 160 may then take off by operating propellers 166 to generate an upward thrust (e.g., a thrust that is generally along the y-axis). Once at a suitable altitude, tail-sitter UAV 160 may use flaps 168 to reorient itself in a horizontal position, such that fuselage 170 is closer to being aligned with the x-axis than the y-axis. Positioned horizontally, propellers 166 may provide forward thrust so that tail-sitter UAV 160 can fly in a similar manner as a typical airplane.

Many variations on the illustrated fixed-wing UAVs are possible. For instance, fixed-wing UAVs may include more or fewer propellers, and/or may utilize a ducted fan or multiple ducted fans for propulsion. Further, UAVs with more wings (e.g., an "x-wing" configuration with four wings), with fewer wings, or even with no wings, are also possible.

Figure 1E:
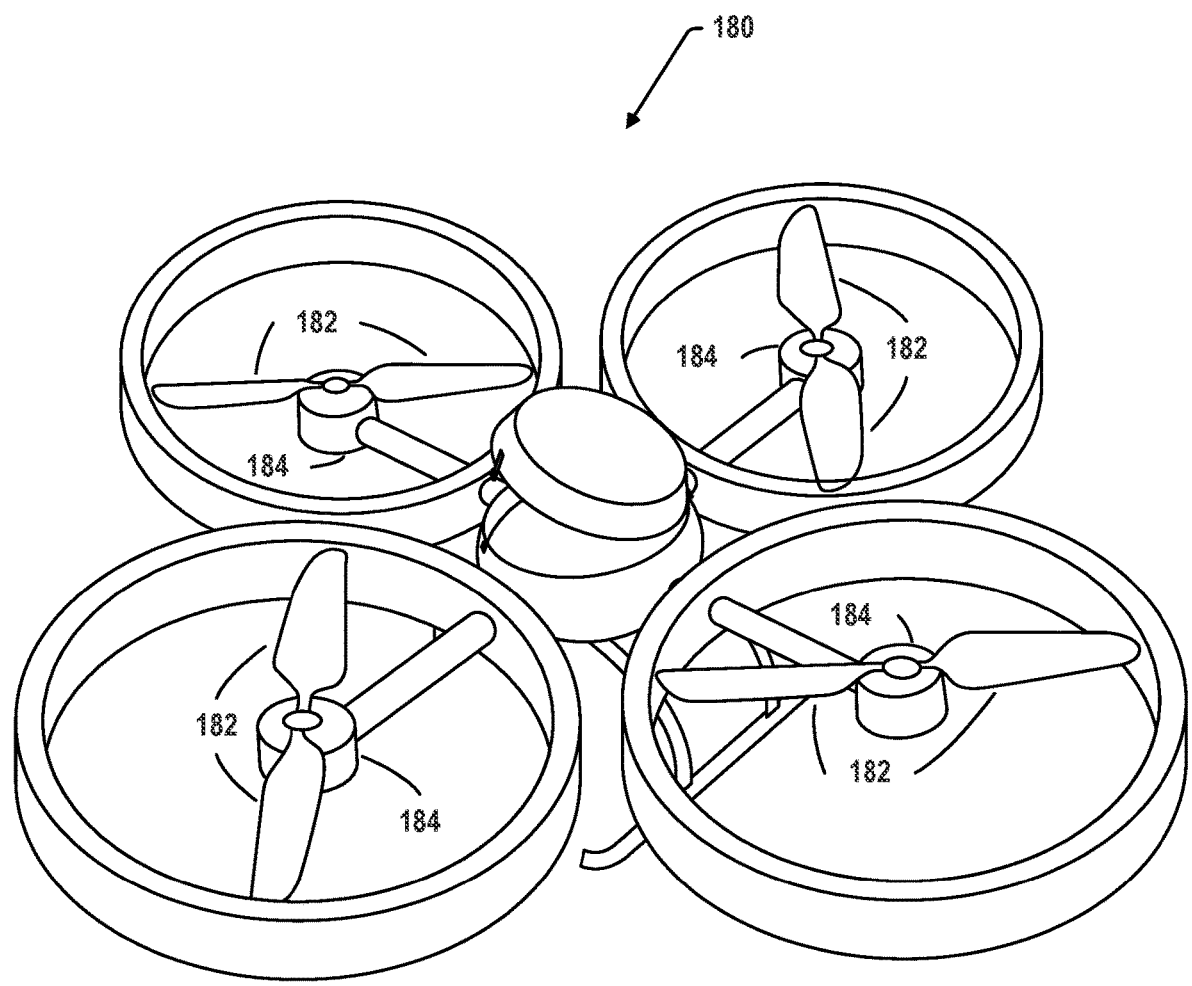
FIG. 1E is a simplified illustration of an unmanned aerial vehicle, in accordance with example embodiments.

As noted above, some embodiments may involve other types of UAVs, in addition to or in the alternative to fixed-wing UAVs. For instance, FIG. 1E shows an example of rotorcraft 180 that is commonly referred to as a multicopter. Multicopter 180 may also be referred to as a quadcopter, as it includes four rotors 182. It should be understood that example embodiments may involve a rotorcraft with more or fewer rotors than multicopter 180. For example, a helicopter typically has two rotors. Other examples with three or more rotors are possible as well. Herein, the term "multicopter" refers to any rotorcraft having more than two rotors, and the term "helicopter" refers to rotorcraft having two rotors.

Referring to multicopter 180 in greater detail, four rotors 182 provide propulsion and maneuverability for multicopter 180. More specifically, each rotor 182 includes blades that are attached to motor 184. Configured as such, rotors 182 may allow multicopter 180 to take off and land vertically, to maneuver in any direction, and/or to hover. Further, the pitch of the blades may be adjusted as a group and/or differentially, and may allow multicopter 180 to control its pitch, roll, yaw, and/or altitude.

It should be understood that references herein to an "unmanned" aerial vehicle or UAV can apply equally to autonomous and semi-autonomous aerial vehicles. In an autonomous implementation, all functionality of the aerial vehicle is automated; e.g., pre-programmed or controlled via real-time computer functionality that responds to input from various sensors and/or pre-determined information. In a semi-autonomous implementation, some functions of an aerial vehicle may be controlled by a human operator, while other functions are carried out autonomously. Further, in some embodiments, a UAV may be configured to allow a remote operator to take over functions that can otherwise be controlled autonomously by the UAV. Yet further, a given type of function may be controlled remotely at one level of abstraction and performed autonomously at another level of abstraction. For example, a remote operator could control high level navigation decisions for a UAV, such as by specifying that the UAV should travel from one location to another (e.g., from a warehouse in a suburban area to a delivery address in a nearby city), while the UAV's navigation system autonomously controls more fine-grained navigation decisions, such as the specific route to take between the two locations, specific flight controls to achieve the route and avoid obstacles while navigating the route, and so on.

More generally, it should be understood that the example UAVs described herein are not intended to be limiting. Example embodiments may relate to, be implemented within, or take the form of any type of unmanned aerial vehicle.

III. EXAMPLE UAV COMPONENTS

Figure 2:
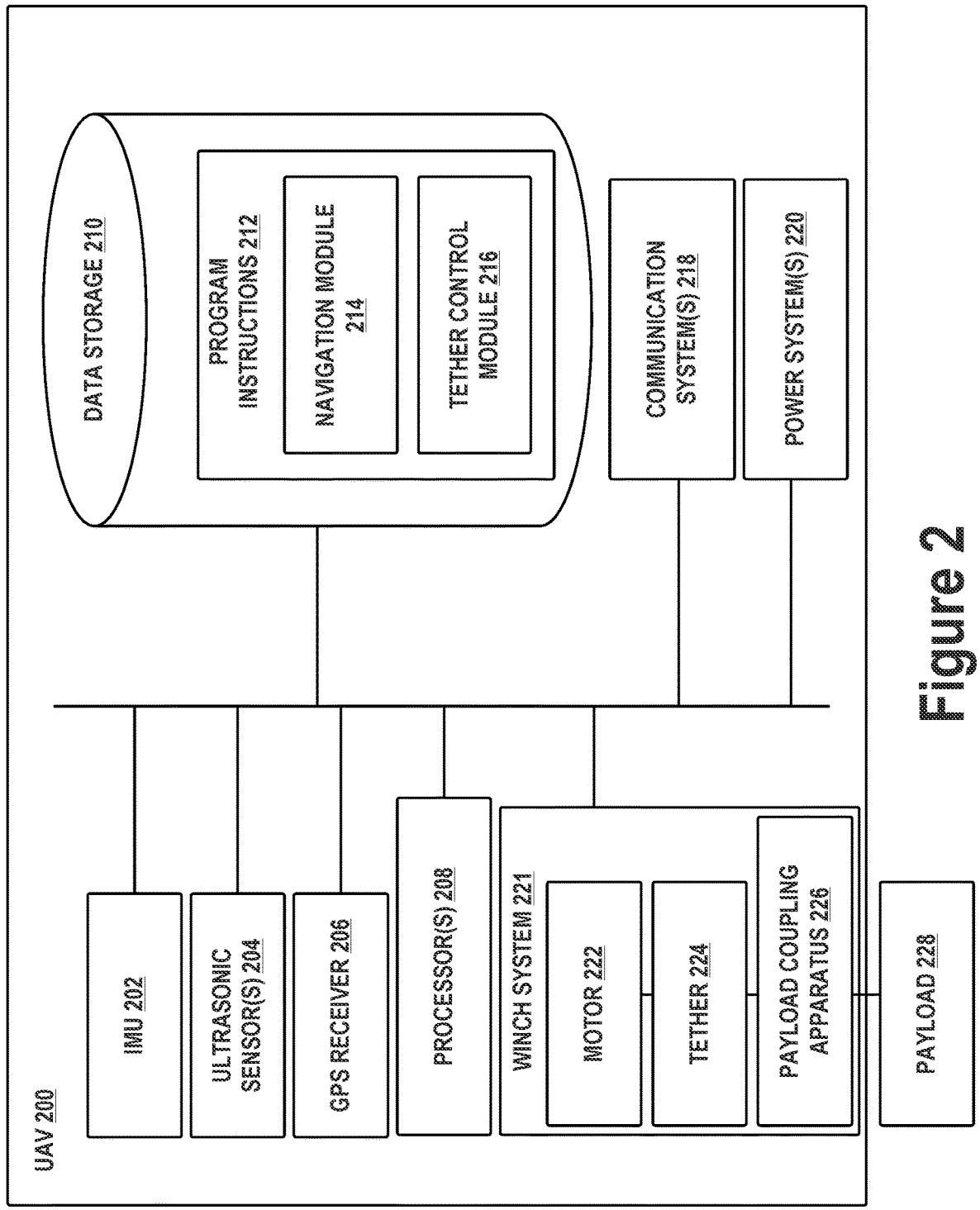
FIG. 2 is a simplified block diagram illustrating components of an unmanned aerial system, in accordance with example embodiments.

FIG. 2 is a simplified block diagram illustrating components of UAV 200, according to an example embodiment. UAV 200 may take the form of, or be similar in form to, one of UAVs 100, 120, 140, 160, and 180 described in reference to FIGS. 1A-1E. However, UAV 200 may also take other forms.

UAV 200 may include various types of sensors, and may include a computing system configured to provide the functionality described herein. In the illustrated embodiment, the sensors of UAV 200 include inertial measurement unit (IMU) 202, ultrasonic sensor(s) 204, and GPS receiver 206, among other possible sensors and sensing systems.

In the illustrated embodiment, UAV 200 also includes processor(s) 208. Processor 208 may be a general-purpose processor or a special purpose processor (e.g., digital signal processors, application specific integrated circuits, etc.). Processor(s) 208 can be configured to execute computer-readable program instructions 212 that are stored in data storage 210 and are executable to provide the functionality of a UAV described herein.

Data storage 210 may include or take the form of one or more computer-readable storage media that can be read or accessed by at least one processor 208. The one or more computer-readable storage media can include volatile and/or non-volatile storage components, such as optical, magnetic, organic or other memory or disc storage, which can be integrated in whole or in part with at least one of processor(s) 208. In some embodiments, data storage 210 can be implemented using a single physical device (e.g., one optical, magnetic, organic or other memory or disc storage unit), while in other embodiments, data storage 210 can be implemented using two or more physical devices.

As noted, data storage 210 can include computer-readable program instructions 212 and perhaps additional data, such as diagnostic data of UAV 200. As such, data storage 210 may include program instructions 212 to perform or facilitate some or all of the UAV functionality described herein. For instance, in the illustrated embodiment, program instructions 212 include navigation module 214 and tether control module 216.

A. Sensors

In an illustrative embodiment, IMU 202 may include both an accelerometer and a gyroscope, which may be used together to determine an orientation of UAV 200. In particular, the accelerometer can measure the orientation of the vehicle with respect to earth, while the gyroscope measures the rate of rotation around an axis. IMUs are commercially available in low-cost, low-power packages. For instance, IMU 202 may take the form of or include a miniaturized MicroElectroMechanical System (MEMS) or a NanoElectroMechanical System (NEMS). Other types of IMUs may also be utilized.

IMU 202 may include other sensors, in addition to accelerometers and gyroscopes, which may help to better determine position and/or help to increase autonomy of UAV 200. Two examples of such sensors are magnetometers and pressure sensors. In some embodiments, a UAV may include a low-power, digital 3-axis magnetometer, which can be used to realize an orientation independent electronic compass for accurate heading information. However, other types of magnetometers may be utilized as well. Other examples are also possible. Further, note that a UAV could include some or all of the above-described inertia sensors as separate components from an IMU.

UAV 200 may also include a pressure sensor or barometer, which can be used to determine the altitude of UAV 200. Alternatively, other sensors, such as sonic altimeters or radar altimeters, can be used to provide an indication of altitude, which may help to improve the accuracy of and/or prevent drift of an IMU.

In a further aspect, UAV 200 may include one or more sensors that allow the UAV to sense objects in the environment. For instance, in the illustrated embodiment, UAV 200 includes ultrasonic sensor(s) 204. Ultrasonic sensor(s) 204 can determine the distance to an object by generating sound waves and determining the time interval between transmission of the wave and receiving the corresponding echo off an object. A typical application of an ultrasonic sensor for unmanned vehicles or IMUs is low-level altitude control and obstacle avoidance. An ultrasonic sensor can also be used for vehicles that need to hover at a certain height or need to be capable of detecting obstacles. Other systems can be used to determine, sense the presence of, and/or determine the distance to nearby objects, such as a light detection and ranging (LIDAR) system, laser detection and ranging (LADAR) system, and/or an infrared or forward-looking infrared (FLIR) system, among other possibilities.

In some embodiments, UAV 200 may also include one or more imaging system(s). For example, one or more still and/or video cameras may be utilized by UAV 200 to capture image data from the UAV's environment. As a specific example, charge-coupled device (CCD) cameras or complementary metal-oxide-semiconductor (CMOS) cameras can be used with unmanned vehicles. Such imaging sensor(s) have numerous possible applications, such as obstacle avoidance, localization techniques, ground tracking for more accurate navigation (e.g., by applying optical flow techniques to images), video feedback, and/or image recognition and processing, among other possibilities.

UAV 200 may also include GPS receiver 206. GPS receiver 206 may be configured to provide data that is typical of well-known GPS systems, such as the GPS coordinates of UAV 200. Such GPS data may be utilized by UAV 200 for various functions. As such, the UAV may use GPS receiver 206 to help navigate to the caller's location, as indicated, at least in part, by the GPS coordinates provided by their mobile device. Other examples are also possible.

B. Navigation and Location Determination

Navigation module 214 may provide functionality that allows UAV 200 to, for example, move about its environment and reach a desired location. To do so, navigation module 214 may control the altitude and/or direction of flight by controlling the mechanical features of the UAV that affect flight (e.g., its rudder(s), elevator(s), aileron(s), and/or the speed of its propeller(s)).

In order to navigate UAV 200 to a target location, navigation module 214 may implement various navigation techniques, such as map-based navigation and localization-based navigation, for instance. With map-based navigation, UAV 200 may be provided with a map of its environment, which may then be used to navigate to a particular location on the map. With localization-based navigation, UAV 200 may be capable of navigating in an unknown environment using localization. Localization-based navigation may involve UAV 200 building its own map of its environment and calculating its position within the map and/or the position of objects in the environment. For example, as UAV 200 moves throughout its environment, UAV 200 may continuously use localization to update its map of the environment. This continuous mapping process may be referred to as simultaneous localization and mapping (SLAM). Other navigation techniques may also be utilized.

In some embodiments, navigation module 214 may navigate using a technique that relies on waypoints. In particular, waypoints are sets of coordinates that identify points in physical space. For instance, an air-navigation waypoint may be defined by a certain latitude, longitude, and altitude. Accordingly, navigation module 214 may cause UAV 200 to move from waypoint to waypoint, in order to ultimately travel to a final destination (e.g., a final waypoint in a sequence of waypoints).

In a further aspect, navigation module 214 and/or other components and systems of UAV 200 may be configured for "localization" to more precisely navigate to the scene of a target location. More specifically, it may be desirable in certain situations for a UAV to be within a threshold distance of the target location where payload 228 is being delivered by a UAV (e.g., within a few feet of the target destination). To this end, a UAV may use a two-tiered approach in which it uses a more-general location-determination technique to navigate to a general area that is associated with the target location, and then use a more-refined location-determination technique to identify and/or navigate to the target location within the general area.

For example, UAV 200 may navigate to the general area of a target destination where payload 228 is being delivered using waypoints and/or map-based navigation. The UAV may then switch to a mode in which it utilizes a localization process to locate and travel to a more specific location. For instance, if UAV 200 is to deliver a payload to a user's home, UAV 200 may need to be substantially close to the target location in order to avoid delivery of the payload to undesired areas (e.g., onto a roof, into a pool, onto a neighbor's property, etc.). However, a GPS signal may only get UAV 200 so far (e.g., within a block of the user's home). A more precise location-determination technique may then be used to find the specific target location.

Various types of location-determination techniques may be used to accomplish localization of the target delivery location once UAV 200 has navigated to the general area of the target delivery location. For instance, UAV 200 may be equipped with one or more sensory systems, such as, for example, ultrasonic sensors 204, infrared sensors (not shown), and/or other sensors, which may provide input that navigation module 214 utilizes to navigate autonomously or semi-autonomously to the specific target location.

As another example, once UAV 200 reaches the general area of the target delivery location (or of a moving subject such as a person or their mobile device), UAV 200 may switch to a "fly-by-wire" mode where it is controlled, at least in part, by a remote operator, who can navigate UAV 200 to the specific target location. To this end, sensory data from UAV 200 may be sent to the remote operator to assist them in navigating UAV 200 to the specific location.

As yet another example, UAV 200 may include a module that is able to signal to a passer-by for assistance in reaching the specific target delivery location. For example, the UAV 200 may display a visual message requesting such assistance in a graphic display or play an audio message or tone through speakers to indicate the need for such assistance, among other possibilities. Such a visual or audio message might indicate that assistance is needed in delivering UAV 200 to a particular person or a particular location, and might provide information to assist the passer-by in delivering UAV 200 to the person or location (e.g., a description or picture of the person or location, and/or the person or location's name), among other possibilities. Such a feature can be useful in a scenario in which the UAV is unable to use sensory functions or another location-determination technique to reach the specific target location. However, this feature is not limited to such scenarios.

In some embodiments, once UAV 200 arrives at the general area of a target delivery location, UAV 200 may utilize a beacon from a user's remote device (e.g., the user's mobile phone) to locate the person. Such a beacon may take various forms. As an example, consider the scenario where a remote device, such as the mobile phone of a person who requested a UAV delivery, is able to send out directional signals (e.g., via an RF signal, a light signal and/or an audio signal). In this scenario, UAV 200 may be configured to navigate by "sourcing" such directional signals—in other words, by determining where the signal is strongest and navigating accordingly. As another example, a mobile device can emit a frequency, either in the human range or outside the human range, and UAV 200 can listen for that frequency and navigate accordingly. As a related example, if UAV 200 is listening for spoken commands, then UAV 200 could utilize spoken statements, such as "I'm over here!" to source the specific location of the person requesting delivery of a payload.

In an alternative arrangement, a navigation module may be implemented at a remote computing device, which communicates wirelessly with UAV 200. The remote computing device may receive data indicating the operational state of UAV 200, sensor data from UAV 200 that allows it to assess the environmental conditions being experienced by UAV 200, and/or location information for UAV 200. Provided with such information, the remote computing device may determine altitudinal and/or directional adjustments that should be made by UAV 200 and/or may determine how UAV 200 should adjust its mechanical features (e.g., its rudder(s), elevator(s), aileron(s), and/or the speed of its propeller(s)) in order to effectuate such movements. The remote computing system may then communicate such adjustments to UAV 200 so it can move in the determined manner.

C. Communication Systems

In a further aspect, UAV 200 includes one or more communication system(s) 218. Communications system(s) 218 may include one or more wireless interfaces and/or one or more wireline interfaces, which allow UAV 200 to communicate via one or more networks. Such wireless interfaces may provide for communication under one or more wireless communication protocols, such as Bluetooth, WiFi (e.g., an IEEE 902.11 protocol), Long-Term Evolution (LTE), WiMAX (e.g., an IEEE 902.16 standard), a radiofrequency ID (RFID) protocol, near-field communication (NFC), and/or other wireless communication protocols. Such wireline interfaces may include an Ethernet interface, a Universal Serial Bus (USB) interface, or similar interface to communicate via a wire, a twisted pair of wires, a coaxial cable, an optical link, a fiber-optic link, or other physical connection to a wireline network.

In some embodiments, UAV 200 may include communication systems 218 that allow for both short-range communication and long-range communication. For example, UAV 200 may be configured for short-range communications using Bluetooth and for long-range communications under a CDMA protocol. In such an embodiment, UAV 200 may be configured to function as a "hot spot;" or in other words, as a gateway or proxy between a remote support device and one or more data networks, such as a cellular network and/or the Internet. Configured as such, UAV 200 may facilitate data communications that the remote support device would otherwise be unable to perform by itself.

For example, UAV 200 may provide a WiFi connection to a remote device, and serve as a proxy or gateway to a cellular service provider's data network, which the UAV might connect to under an LTE or a 3G protocol, for instance. UAV 200 could also serve as a proxy or gateway to a high-altitude balloon network, a satellite network, or a combination of these networks, among others, which a remote device might not be able to otherwise access.

D. Power Systems

In a further aspect, UAV 200 may include power system(s) 220. Power system(s) 220 may include one or more batteries for providing power to UAV 200. In one example, the one or more batteries may be rechargeable and each battery may be recharged via a wired connection between the battery and a power supply and/or via a wireless charging system, such as an inductive charging system that applies an external time-varying magnetic field to an internal battery.

E. Payload Delivery

UAV 200 may employ various systems and configurations in order to transport and deliver payload 228. In some implementations, payload 228 of UAV 200 may include or take the form of a "package" designed to transport various goods to a target delivery location. For example, UAV 200 can include a compartment, in which an item or items may be transported. Such a package may one or more food items, purchased goods, medical items, or any other object(s) having a size and weight suitable to be transported between two locations by the UAV. In other embodiments, payload 228 may simply be the one or more items that are being delivered (e.g., without any package housing the items).

In some embodiments, payload 228 may be attached to the UAV and located substantially outside of the UAV during some or all of a flight by the UAV. For example, the package may be tethered or otherwise releasably attached below the UAV during flight to a target location. In an embodiment where a package carries goods below the UAV, the package may include various features that protect its contents from the environment, reduce aerodynamic drag on the system, and prevent the contents of the package from shifting during UAV flight.

For instance, when payload 228 takes the form of a package for transporting items, the package may include an outer shell constructed of water-resistant cardboard, plastic, or any other lightweight and water-resistant material. Further, in order to reduce drag, the package may feature smooth surfaces with a pointed front that reduces the frontal cross-sectional area. Further, the sides of the package may taper from a wide bottom to a narrow top, which allows the package to serve as a narrow pylon that reduces interference effects on the wing(s) of the UAV. This may move some of the frontal area and volume of the package away from the wing(s) of the UAV, thereby preventing the reduction of lift on the wing(s) cause by the package. Yet further, in some embodiments, the outer shell of the package may be constructed from a single sheet of material in order to reduce air gaps or extra material, both of which may increase drag on the system. Additionally or alternatively, the package may include a stabilizer to dampen package flutter. This reduction in flutter may allow the package to have a less rigid connection to the UAV and may cause the contents of the package to shift less during flight.

In order to deliver the payload, the UAV may include winch system 221 controlled by tether control module 216 in order to lower payload 228 to the ground while UAV 200 hovers above. As shown in FIG. 2, winch system 221 may include tether 224, and tether 224 may be coupled to payload 228 by payload coupling apparatus 226. Tether 224 may be wound on a spool that is coupled to motor 222 of the UAV. Motor 222 may take the form of a DC motor (e.g., a servo motor) that can be actively controlled by a speed controller. Tether control module 216 can control the speed controller to cause motor 222 to rotate the spool, thereby unwinding or retracting tether 224 and lowering or raising payload coupling apparatus 226. In practice, the speed controller may output a desired operating rate (e.g., a desired RPM) for the spool, which may correspond to the speed at which tether 224 and payload 228 should be lowered towards the ground. Motor 222 may then rotate the spool so that it maintains the desired operating rate.

In order to control motor 222 via the speed controller, tether control module 216 may receive data from a speed sensor (e.g., an encoder) configured to convert a mechanical position to a representative analog or digital signal. In particular, the speed sensor may include a rotary encoder that may provide information related to rotary position (and/or rotary movement) of a shaft of the motor or the spool coupled to the motor, among other possibilities. Moreover, the speed sensor may take the form of an absolute encoder and/or an incremental encoder, among others. So in an example implementation, as motor 222 causes rotation of the spool, a rotary encoder may be used to measure this rotation. In doing so, the rotary encoder may be used to convert a rotary position to an analog or digital electronic signal used by tether control module 216 to determine the amount of rotation of the spool from a fixed reference angle and/or to an analog or digital electronic signal that is representative of a new rotary position, among other options. Other examples are also possible.

Based on the data from the speed sensor, tether control module 216 may determine a rotational speed of motor 222 and/or the spool and responsively control motor 222 (e.g., by increasing or decreasing an electrical current supplied to motor 222) to cause the rotational speed of motor 222 to match a desired speed. When adjusting the motor current, the magnitude of the current adjustment may be based on a proportional-integral-derivative (PID) calculation using the determined and desired speeds of motor 222. For instance, the magnitude of the current adjustment may be based on a present difference, a past difference (based on accumulated error over time), and a future difference (based on current rates of change) between the determined and desired speeds of the spool.

In some embodiments, tether control module 216 may vary the rate at which tether 224 and payload 228 are lowered to the ground. For example, the speed controller may change the desired operating rate according to a variable deployment-rate profile and/or in response to other factors in order to change the rate at which payload 228 descends toward the ground. To do so, tether control module 216 may adjust an amount of braking or an amount of friction that is applied to tether 224. For example, to vary the tether deployment rate, UAV 200 may include friction pads that can apply a variable amount of pressure to tether 224. As another example, UAV 200 can include a motorized braking system that varies the rate at which the spool lets out tether 224. Such a braking system may take the form of an electromechanical system in which motor 222 operates to slow the rate at which the spool lets out tether 224. Further, motor 222 may vary the amount by which it adjusts the speed (e.g., the RPM) of the spool, and thus may vary the deployment rate of tether 224. Other examples are also possible.

In some embodiments, tether control module 216 may be configured to limit the motor current supplied to motor 222 to a maximum value. With such a limit placed on the motor current, there may be situations where motor 222 cannot operate at the desired rate specified by the speed controller. For instance, there may be situations where the speed controller specifies a desired operating rate at which motor 222 should retract tether 224 toward UAV 200, but the motor current may be limited such that a large enough downward force on tether 224 would counteract the retracting force of motor 222 and cause tether 224 to unwind instead. A limit on the motor current may be imposed and/or altered depending on an operational state of UAV 200.

In some embodiments, tether control module 216 may be configured to determine a status of tether 224 and/or payload 228 based on the amount of current supplied to motor 222. For instance, if a downward force is applied to tether 224 (e.g., if payload 228 is attached to tether 224 or if tether 224 gets snagged on an object when retracting toward UAV 200), tether control module 216 may need to increase the motor current in order to cause the determined rotational speed of motor 222 and/or spool to match the desired speed. Similarly, when the downward force is removed from tether 224 (e.g., upon delivery of payload 228 or removal of a tether snag), tether control module 216 may need to decrease the motor current in order to cause the determined rotational speed of motor 222 and/or spool to match the desired speed. As such, tether control module 216 may be configured to monitor the current supplied to motor 222. For instance, tether control module 216 could determine the motor current based on sensor data received from a current sensor of the motor or a current sensor of power system 220. In any case, based on the current supplied to motor 222, tether control module 216 may determine if payload 228 is attached to tether 224, if someone or something is pulling on tether 224, and/or if payload coupling apparatus 226 is pressing against UAV 200 after retracting tether 224. Other examples are possible as well.

During delivery of payload 228, payload coupling apparatus 226 can be configured to secure payload 228 while being lowered from the UAV by tether 224, and can be further configured to release payload 228 upon reaching ground level. Payload coupling apparatus 226 can then be retracted to the UAV by reeling in tether 224 using motor 222.

In some implementations, payload 228 may be passively released once it is lowered to the ground. For example, a passive release mechanism may include one or more swing arms adapted to retract into and extend from a housing. An extended swing arm may form a hook on which payload 228 may be attached. Upon lowering the release mechanism and payload 228 to the ground via a tether, a gravitational force as well as a downward inertial force on the release mechanism may cause payload 228 to detach from the hook allowing the release mechanism to be raised upwards toward the UAV. The release mechanism may further include a spring mechanism that biases the swing arm to retract into the housing when there are no other external forces on the swing arm. For instance, a spring may exert a force on the swing arm that pushes or pulls the swing arm toward the housing such that the swing arm retracts into the housing once the weight of payload 228 no longer forces the swing arm to extend from the housing. Retracting the swing arm into the housing may reduce the likelihood of the release mechanism snagging payload 228 or other nearby objects when raising the release mechanism toward the UAV upon delivery of payload 228.

Active payload release mechanisms are also possible. For example, sensors such as a barometric pressure based altimeter and/or accelerometers may help to detect the position of the release mechanism (and the payload) relative to the ground. Data from the sensors can be communicated back to the UAV and/or a control system over a wireless link and used to help in determining when the release mechanism has reached ground level (e.g., by detecting a measurement with the accelerometer that is characteristic of ground impact). In other examples, the UAV may determine that the payload has reached the ground based on a weight sensor detecting a threshold low downward force on the tether and/or based on a threshold low measurement of power drawn by the winch when lowering the payload.

Other systems and techniques for delivering a payload, in addition or in the alternative to a tethered delivery system are also possible. For example, UAV 200 could include an air-bag drop system or a parachute drop system. Alternatively, UAV 200 carrying a payload could simply land on the ground at a delivery location. Other examples are also possible.

IV. EXAMPLE UAV DEPLOYMENT SYSTEMS

Figure 3:
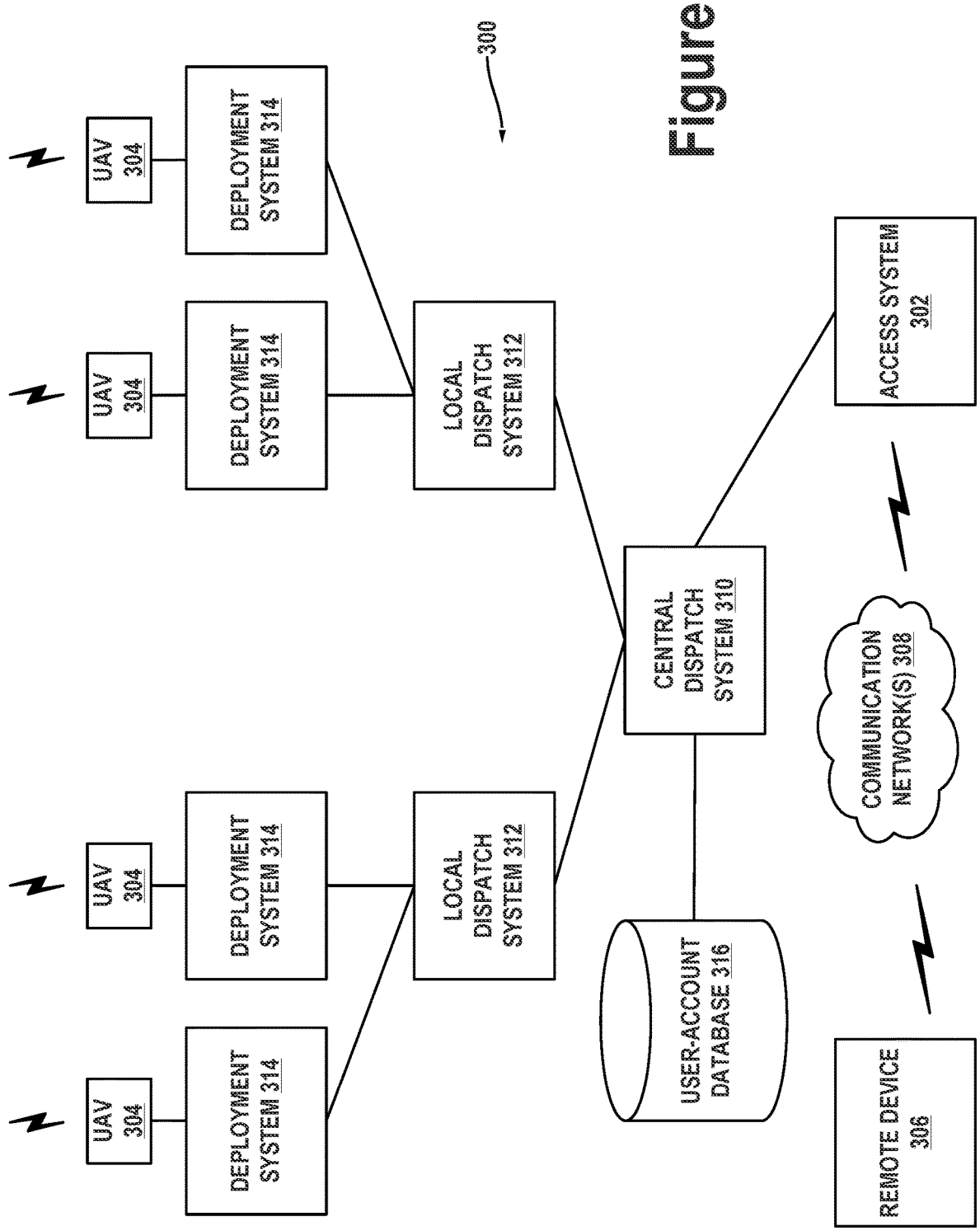
FIG. 3 is a simplified block diagram illustrating a distributed UAV system, in accordance with example embodiments.

UAV systems may be implemented in order to provide various UAV-related services. In particular, UAVs may be provided at a number of different launch sites that may be in communication with regional and/or central control systems. Such a distributed UAV system may allow UAVs to be quickly deployed to provide services across a large geographic area (e.g., that is much larger than the flight range of any single UAV). For example, UAVs capable of carrying payloads may be distributed at a number of launch sites across a large geographic area (possibly even throughout an entire country, or even worldwide), in order to provide on-demand transport of various items to locations throughout the geographic area. FIG. 3 is a simplified block diagram illustrating a distributed UAV system 300, according to an example embodiment.

In the illustrative UAV system 300, access system 302 may allow for interaction with, control of, and/or utilization of a network of UAVs 304. In some embodiments, access system 302 may be a computing system that allows for human-controlled dispatch of UAVs 304. As such, the control system may include or otherwise provide a user interface through which a user can access and/or control UAVs 304.

In some embodiments, dispatch of UAVs 304 may additionally or alternatively be accomplished via one or more automated processes. For instance, access system 302 may dispatch one of UAVs 304 to transport a payload to a target location, and the UAV may autonomously navigate to the target location by utilizing various on-board sensors, such as a GPS receiver and/or other various navigational sensors.

Further, access system 302 may provide for remote operation of a UAV. For instance, access system 302 may allow an operator to control the flight of a UAV via its user interface. As a specific example, an operator may use access system 302 to dispatch one of UAVs 304 to a target location. The dispatched UAV may then autonomously navigate to the general area of the target location. At this point, the operator may use access system 302 to take control of the dispatched UAV and navigate the dispatched UAV to the target location (e.g., to a particular person to whom a payload is being transported). Other examples of remote operation of a UAV are also possible.

In an illustrative embodiment, UAVs 304 may take various forms. For example, each of UAVs 304 may be a UAV such as those illustrated in FIG. 1A, 1B, 1C, 1D, 1E, or 2. However, UAV system 300 may also utilize other types of UAVs without departing from the scope of the invention. In some implementations, all of UAVs 304 may be of the same or a similar configuration. However, in other implementations, UAVs 304 may include a number of different types of UAVs. For instance, UAVs 304 may include a number of types of UAVs, with each type of UAV being configured for a different type or types of payload delivery capabilities.

UAV system 300 may further include remote device 306, which may take various forms. Generally, remote device 306 may be any device through which a direct or indirect request to dispatch a UAV can be made. Note that an indirect request may involve any communication that may be responded to by dispatching a UAV, such as requesting a package delivery. In an example embodiment, remote device 306 may be a mobile phone, tablet computer, laptop computer, personal computer, or any network-connected computing device. Further, in some instances, remote device 306 may not be a computing device. As an example, a standard telephone, which allows for communication via plain old telephone service (POTS), may serve as remote device 306. Other types of remote devices are also possible.

Further, remote device 306 may be configured to communicate with access system 302 via one or more types of communication network(s) 308. For example, remote device 306 may communicate with access system 302 (or a human operator of access system 302) by communicating over a POTS network, a cellular network, and/or a data network such as the Internet. Other types of networks may also be utilized.

In some embodiments, remote device 306 may be configured to allow a user to request pick-up of one or more items from a certain source location and/or delivery of one or more items to a desired location. For example, a user could request UAV delivery of a package to their home via their mobile phone, tablet, or laptop. As another example, a user could request dynamic delivery to wherever they are located at the time of delivery. To provide such dynamic delivery, UAV system 300 may receive location information (e.g., GPS coordinates, etc.) from the user's mobile phone, or any other device on the user's person, such that a UAV can navigate to the user's location (as indicated by their mobile phone).

In some embodiments, a business user (e.g., a restaurant) could utilize one or more remote devices 306 to request that a UAV be dispatched to pick-up one or more items (e.g., a food order) from a source location (e.g., the restaurant's address), and then deliver the one or more items to a target location (e.g., a customer's address). Further, in such embodiments, there may be multiple instances of remote device 306 associated with a common item provider account (e.g., an account used by multiple employees and/or owners of a particular restaurant). Additionally, in such embodiments, remote device 306 may be utilized to send item provider submissions to a transport provider computing system (e.g., central dispatch system 310 and or local dispatch system 312), which each indicate a respective quantitative measure for a given amount of UAV transport service at a given future time. For example, remote device 306 may be utilized to generate and send an item provider submission that specifies a level of desired UAV transport services (e.g., number and/or rate of expected UAV delivery flights), and/or a monetary value corresponding to the item provider's need for UAV transport services, at a particular time or during a particular period of time in the future.

In an illustrative arrangement, central dispatch system 310 may be a server or group of servers, which is configured to receive dispatch messages requests and/or dispatch instructions from access system 302. Such dispatch messages may request or instruct central dispatch system 310 to coordinate the deployment of UAVs to various target locations. Central dispatch system 310 may be further configured to route such requests or instructions to one or more local dispatch systems 312. To provide such functionality, central dispatch system 310 may communicate with access system 302 via a data network, such as the Internet or a private network that is established for communications between access systems and automated dispatch systems.

In the illustrated configuration, central dispatch system 310 may be configured to coordinate the dispatch of UAVs 304 from a number of different local dispatch systems 312. As such, central dispatch system 310 may keep track of which ones of UAVs 304 are located at which ones of local dispatch systems 312, which UAVs 304 are currently available for deployment, and/or which services or operations each of UAVs 304 is configured for (in the event that a UAV fleet includes multiple types of UAVs configured for different services and/or operations). Additionally or alternatively, each local dispatch system 312 may be configured to track which of its associated UAVs 304 are currently available for deployment and/or are currently in the midst of item transport.

In some cases, when central dispatch system 310 receives a request for UAV-related service (e.g., transport of an item) from access system 302, central dispatch system 310 may select a specific one of UAVs 304 to dispatch. Central dispatch system 310 may accordingly instruct local dispatch system 312 that is associated with the selected UAV to dispatch the selected UAV. Local dispatch system 312 may then operate its associated deployment system 314 to launch the selected UAV. In other cases, central dispatch system 310 may forward a request for a UAV-related service to one of local dispatch systems 312 that is near the location where the support is requested and leave the selection of a particular one of UAVs 304 to local dispatch system 312.

In an example configuration, local dispatch system 312 may be implemented as a computing system at the same location as deployment system(s) 314 that it controls. For example, a particular one of local dispatch system 312 may be implemented by a computing system installed at a building, such as a warehouse, where deployment system(s) 314 and UAV(s) 304 that are associated with the particular one of local dispatch systems 312 are also located. In other embodiments, the particular one of local dispatch systems 312 may be implemented at a location that is remote to its associated deployment system(s) 314 and UAV(s) 304.

Numerous variations on and alternatives to the illustrated configuration of UAV system 300 are possible. For example, in some embodiments, a user of remote device 306 could request delivery of a package directly from central dispatch system 310. To do so, an application may be implemented on remote device 306 that allows the user to provide information regarding a requested delivery, and generate and send a data message to request that UAV system 300 provide the delivery. In such an embodiment, central dispatch system 310 may include automated functionality to handle requests that are generated by such an application, evaluate such requests, and, if appropriate, coordinate with an appropriate local dispatch system 312 to deploy a UAV.

Further, some or all of the functionality that is attributed herein to central dispatch system 310, local dispatch system(s) 312, access system 302, and/or deployment system(s) 314 may be combined in a single system, implemented in a more complex system (e.g., having more layers of control), and/or redistributed among central dispatch system 310, local dispatch system(s) 312, access system 302, and/or deployment system(s) 314 in various ways.

Yet further, while each local dispatch system 312 is shown as having two associated deployment systems 314, a given local dispatch system 312 may alternatively have more or fewer associated deployment systems 314. Similarly, while central dispatch system 310 is shown as being in communication with two local dispatch systems 312, central dispatch system 310 may alternatively be in communication with more or fewer local dispatch systems 312.

In a further aspect, deployment systems 314 may take various forms. In some implementations, some or all of deployment systems 314 may be a structure or system that passively facilitates a UAV taking off from a resting position to begin a flight. For example, some or all of deployment systems 314 may take the form of a landing pad, a hangar, and/or a runway, among other possibilities. As such, a given deployment system 314 may be arranged to facilitate deployment of one UAV 304 at a time, or deployment of multiple UAVs (e.g., a landing pad large enough to be utilized by multiple UAVs concurrently).

Additionally or alternatively, some or all of deployment systems 314 may take the form of or include systems for actively launching one or more of UAVs 304. Such launch systems may include features that provide for an automated UAV launch and/or features that allow for a human-assisted UAV launch. Further, a given deployment system 314 may be configured to launch one particular UAV 304, or to launch multiple UAVs 304.

Note that deployment systems 314 may also be configured to passively facilitate and/or actively assist a UAV when landing. For example, the same landing pad could be used for take-off and landing. Additionally or alternatively, a deployment system could include a robotic arm operable to receive an incoming UAV. Deployment system 314 could also include other structures and/or systems to assist and/or facilitate UAV landing processes. Further, structures and/or systems to assist and/or facilitate UAV landing processes may be implemented as separate structures and/or systems, so long as UAVs can move or be moved from a landing structure or system to deployment system 314 for re-deployment.

Deployment systems 314 may further be configured to provide additional functions, including for example, diagnostic-related functions such as verifying system functionality of the UAV, verifying functionality of devices that are housed within a UAV (e.g., a payload delivery apparatus), and/or maintaining devices or other items that are housed in the UAV (e.g., by monitoring a status of a payload such as its temperature, weight, etc.).

In some embodiments, local dispatch systems 312 (along with their respective deployment system(s) 314 may be strategically distributed throughout an area such as a city. For example, local dispatch systems 312 may be strategically distributed such that each local dispatch systems 312 is proximate to one or more payload pickup locations (e.g., near a restaurant, store, or warehouse). However, local dispatch systems 312 may be distributed in other ways, depending upon the particular implementation.

As an additional example, kiosks that allow users to transport packages via UAVs may be installed in various locations. Such kiosks may include UAV launch systems, and may allow a user to provide their package for loading onto a UAV and pay for UAV shipping services, among other possibilities. Other examples are also possible.

In a further aspect, UAV system 300 may include or have access to user-account database 316. User-account database 316 may include data for a number of user accounts, and which are each associated with one or more person. For a given user account, user-account database 316 may include data related to or useful in providing UAV-related services. Typically, the user data associated with each user account is optionally provided by an associated user and/or is collected with the associated user's permission.

Further, in some embodiments, a person may be required to register for a user account with UAV system 300, if they wish to be provided with UAV-related services by UAVs 304 from UAV system 300. As such, user-account database 316 may include authorization information for a given user account (e.g., a user name and password), and/or other information that may be used to authorize access to a user account.

In some embodiments, a person may associate one or more of their devices with their user account, such that they can access the services of UAV system 300. For example, when a person uses an associated mobile phone to, e.g., place a call to an operator of access system 302 or send a message requesting a UAV-related service to a dispatch system, the phone may be identified via a unique device identification number, and the call or message may then be attributed to the associated user account. Other examples are also possible.

Additionally or alternatively, an item provider that wishes to deliver their products using UAV transport services provided by an aerial transport service provider (ATSP) to deliver, can register for an item provider account with UAV system 300. As such, user-account database 316 may include authorization information for a given item provider account (e.g., one or more user name and password combinations), and/or other information that may be used to authorize access to a given item provider account. Alternatively, data for item provider accounts may be kept in a separate database from recipient user accounts. Other data structures and storage configurations for storing such account data are also possible.

V. UAV TRANSPORT SERVICES WITH SEPARATELY LOCATED ITEM PROVIDERS AND UAV HUBS

Figure 4:
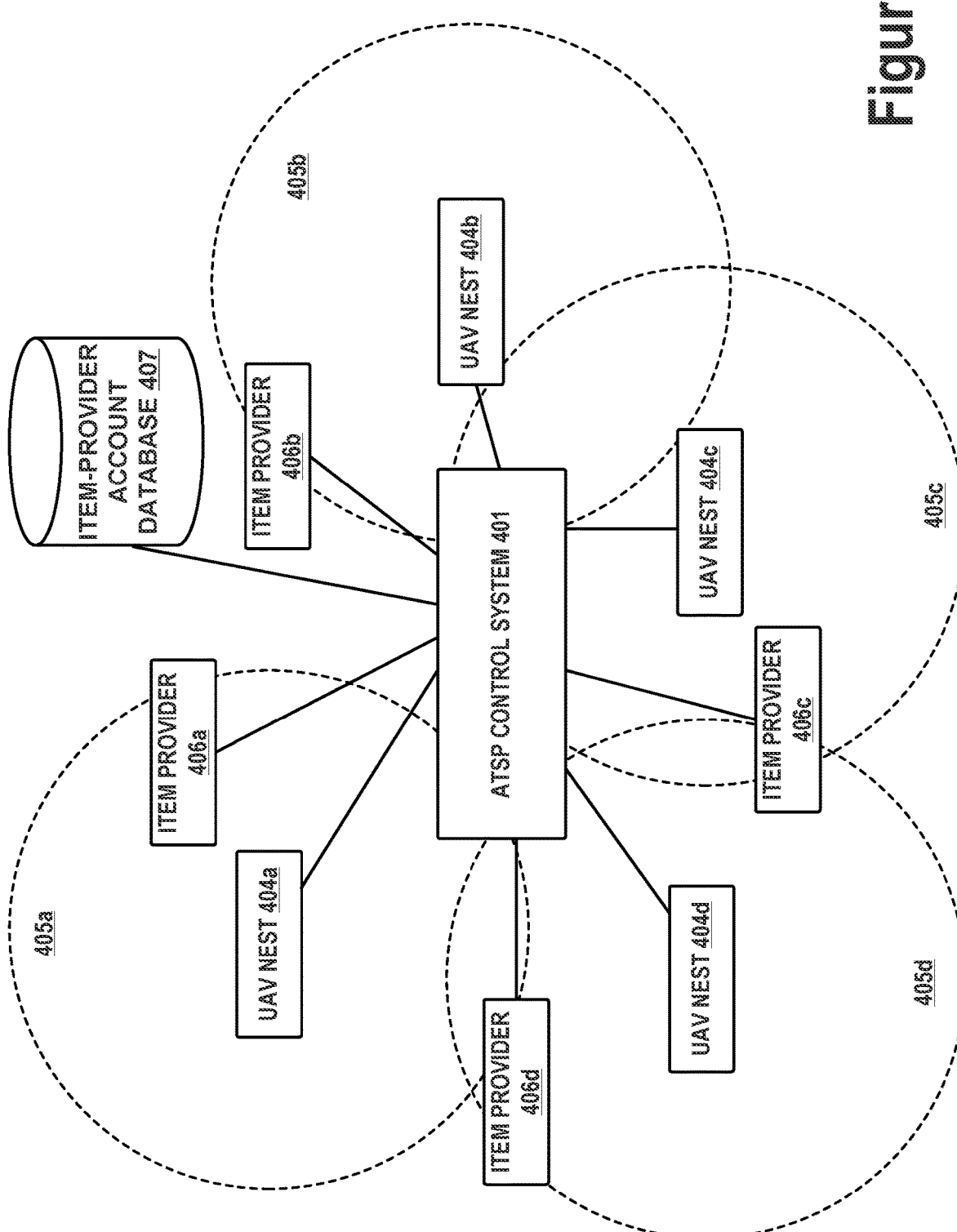
FIG. 4 is a block diagram showing an example arrangement for an aerial transport provider control system, in accordance with example embodiments.

An aerial transport service provider (ATSP) may be a separate entity from the entity or entities that provide the items being transported and/or interface with the recipients who request delivery of these items. For example, a company that operates a fleet of UAVs configured for item delivery may provide delivery services for third-party entities, such as restaurants, clothing stores, grocery stores, and other "brick and mortar" and/or online retailers, among other possibilities. These third-party entities may have accounts with the ATSP, via which the third-parties can request and/or purchase UAV transport services from the ATSP. Further, the third-party entities could interface with recipients (e.g., customers) directly, or through computing systems (e.g., applications and/or server systems) provided by the ATSP FIG. 4 is a block diagram showing an example arrangement for an aerial transport service provider control system 401, which coordinates UAV transport services for a plurality of item providers that are located remotely from the service provider's central UAV dispatch locations (e.g., UAV nests). The ATSP may be a separate entity from the item providers. As shown, ATSP control system 401 may be communicatively coupled to computing or control systems of UAV nests 404a, 404b, 404c, and 404d (i.e., UAV nests 404a-d), and communicatively coupled to computing systems of item providers 406a, 406b, 406c, and 406d (i.e., item providers 406a-d). Such communicative couplings may be implemented using various types of wired and/or wireless communication protocols and networks.

Each of UAV nests 404a-d is a facility where UAVs can be stored for at least a short period of time, and from which UAVs can begin carrying out a UAV transport task (e.g., where UAVs can take off). In some implementations, some or all of the UAV nests may take the form of a local dispatch system and one or more deployment systems, such as those described in reference to FIG. 3 above. Of course, some or all of the UAV nests could also take other forms and/or perform different functions.

Each of the computing systems of item providers 406a-d may be associated with a different item provider account. As such, one or more of the computing systems associated with item providers 406a-d may include one or more computing devices that are authorized to access the corresponding item provider account with the ATSP. Further, the ATSP may store data for item provider accounts in an item provider account database 407.

In practice, one or more of the computing systems of item providers 406a-d may include one or more remote computing devices (e.g., such as one or more remote devices 306 described in reference to FIG. 3), which have logged in to or otherwise been authorized to access the same item provider account (e.g., cell phones, laptops, and/or computing devices of a business's employees). Additionally or alternatively, one or more of the computing systems of item providers 406a-d may be implemented with less of an ad-hoc approach; e.g., with one or more user-interface terminals installed at the item provider's facilities. Other types of item provider computing systems are also possible.

In order to provide UAV transport services to various item providers in an efficient and flexible manner, ATSP control system 401 may dynamically assign different UAVs to transport tasks for different item providers based on demand and/or other factors, rather than permanently assigning each UAV to a particular item provider. As such, the particular UAV or UAVs that carry out transport tasks for a given third-party item provider may vary over time.

\The dynamic assignment of UAVs to flights for a number of different item providers can help an ATSP to more efficiently utilize a group of UAVs (e.g., by reducing unnecessary UAV downtime), as compared to an arrangement where specific UAVs are permanently assigned to specific item providers. More specifically, to dynamically assign UAVs to transport requests from third-party item providers, ATSP control system 401 can dynamically redistribute UAVs amongst a number of UAV deployment locations (which may be referred to as, e.g., "hubs" or "nests") through a service area, according to time-varying levels of demand at various locations or sub-areas within the service area.

Each respective UAV nest of UAV nests 404a-d is shown as having associated therewith a corresponding geographic area 405a, 405b, 405c, and 405d, respectively (i.e., geographic areas 405a-d), within which UAVs of the respective UAV nest provide transport services to item providers and/or item recipients. The geographic area served by a given UAV nest may be defined, at least in part, by the flight range(s) of the UAVs that are located at or scheduled to be located at the given UAV nest. In some implementations, the geographic areas 405a-d corresponding to UAV nests 404a-d may each have a fixed size, which does not vary over time. In other implementations, the size of each of geographic areas 405a-d could vary over time based on various factors, such as demand for UAV transport services in the geographic area and/or nearby geographic areas, the number and/or capabilities of UAVs allocated to operate from the corresponding UAV nest, and/or the number and/or characteristics of item providers located near to the UAV nest, among other possibilities.

Additionally or alternatively, the size of each of geographic areas 405a-d could vary on an order-by-order basis, and/or vary by item provider. More specifically, when a transport task involves three or more flight legs (e.g., a flight from the UAV nest to the item provider for pick-up, a flight from the item provider to a delivery location, and a return flight to the UAV nest), there may be two or more flight legs before delivering an item. Thus, the evaluation of whether or not a given item provider is within the geographic service area of a UAV nest for a given transport task may depend on a combination of the distance from the UAV nest to the item pick-up location, the distance from the pick-up location to the delivery location, and the distance from the delivery location to the UAV nest. As a result, a given UAV nest may be able to serve a given item provider for one transport task, but not for another. In this context, it is possible that the notion of a defined "geographic service area" might not be utilized at all. Instead, ATSP control system 401 may simply evaluate whether a UAV transport task can be implemented on a task-by-task basis, given all of the parameters for completion of the task.

Since certain item providers can only be served by (or are better served by) a certain UAV nest or nests, and because demand for UAV transport services can vary between item providers, ATSP control system 401 may, for a given geographic/service area, implement an ongoing process to distribute and redistribute UAVs amongst the UAV nests 404a-d that collectively serve the given area. In particular, ATSP control system 401 may continually, periodically, or from time-to-time evaluate demand and/or other factors for each item provider 406a-d, and determine a respective number of UAVs that are desirable at each of UAV nests 404a-d, in order to meet the demand for UAV transport tasks in the corresponding geographic area. Additionally or alternatively, ATSP control system 401 could determine a respective number of UAVs that are desirable at each of UAV nest 404a-d such that UAV nests 404a-d can collectively meet demand for UAV transport services in the larger area collectively served by the UAV nests 404*a-d*.

VI. EXAMPLE SYSTEMS AND METHODS FOR CHARGING UAVS

Figure 5:
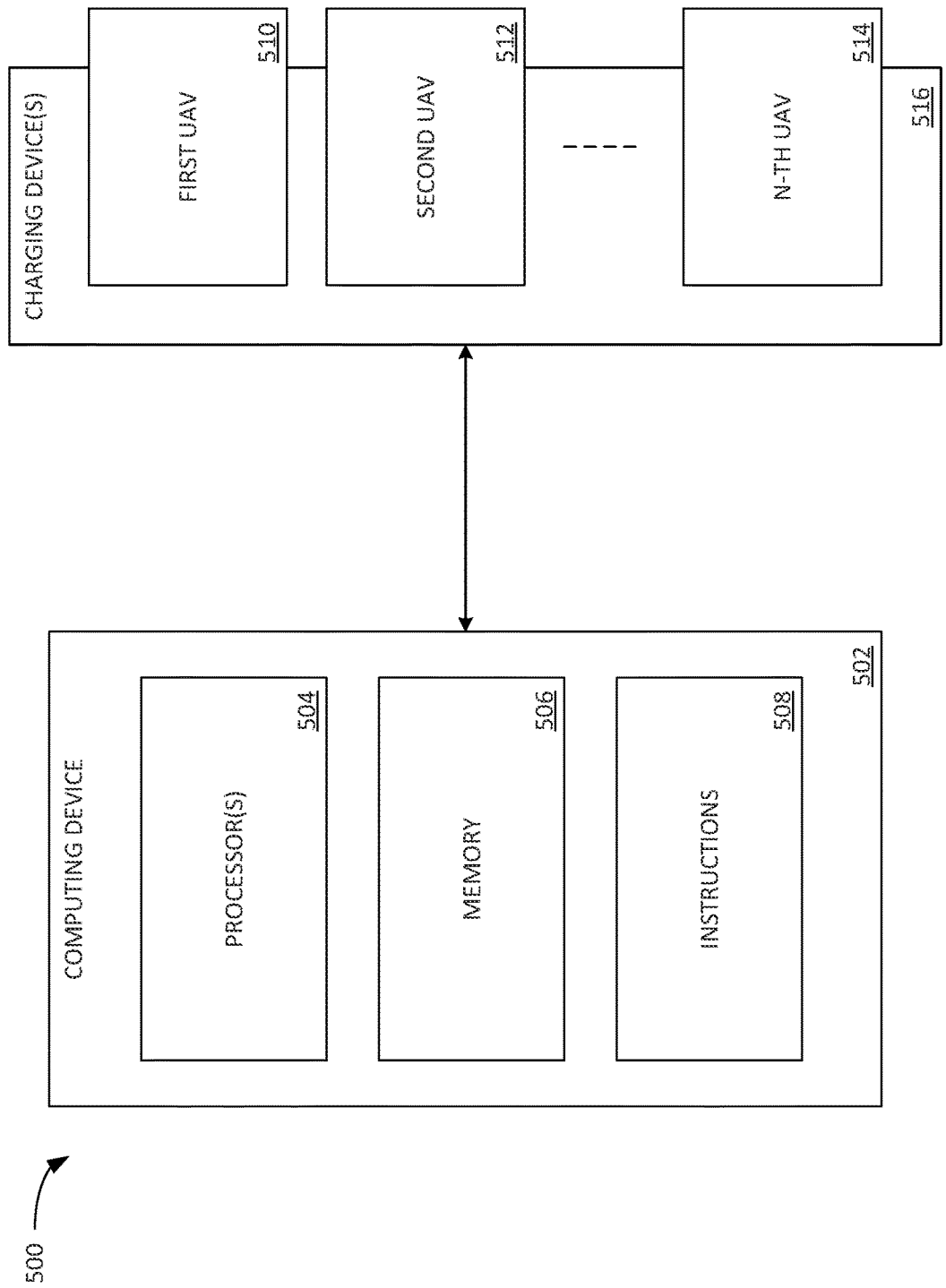
FIG. 5 illustrates a block diagram of a system, in accordance with example embodiments.

FIG. 5 illustrates a block diagram of a system, in accordance with example embodiments. In particular, FIG. 5 shows a system 500. System 500 includes a computing device 502 that serves as a controller of a fleet of UAVs including a first UAV 510, a second UAV 512, and an n-th UAV 514. The fleet of UAVs may include several additional UAVs that are collectively used to perform flight operations, such as delivering payloads. System 500 or components thereof (e.g., computing device 502) may operate at one or more of the nests described above with respect to FIG. 4. For example, system 500 may coordinate charging operations among several nests, or may specifically manage charging operations at a single nest. Within examples, system 500 may include or be a part of a network of computing devices that interact with each other to manage charging batteries of the fleet of UAVs Computing device 502 includes processor(s) 504, a memory 506, and instructions 508 stored in memory 506 and executable by processor(s) 504 to perform functions. Computing device may operate as a battery management system (BMS) for a plurality of batteries in the fleet of UAVs.

Processor(s) 504 may include a general-purpose processor or a special purpose processor (e.g., digital signal processors, application specific integrated circuits, etc.). The one or more processors 504 can be configured to execute computer-readable program instructions that are stored in memory 506 and are executable to functions described herein.

Memory 506 may include or take the form of one or more computer-readable storage media that can be read or accessed by at least one processor of processor(s) 504. The one or more computer-readable storage media can include volatile and/or non-volatile storage components, such as optical, magnetic, organic or other memory or disc storage, which can be integrated in whole or in part with at least one of processor(s) 504. In some embodiments, the memory 506 can be implemented using a single physical device (e.g., one optical, magnetic, organic or other memory or disc storage unit), while in other embodiments, the memory 506 can be implemented using two or more physical devices.

Memory 506 can include instructions 508, such as computer-readable program instructions, and perhaps additional data, such as stored indications of battery capacities and States of Health of batteries in the fleet of UAVs. As such, memory 506 may include instructions 508 to perform or facilitate some or all of the functionality described herein with respect to system 500.

System 500 further includes one or more charging devices 516 configured to charge the fleet of UAVs. Computing device 502 may send control instructions to the one or more charging devices 516 in order to charge first UAV 510, second UAV 512, n-th UAV 514, or any other UAV in the fleet. Each UAV may be charged to different levels based on one or more battery characteristics of a battery that powers the UAV.

Each UAV may include one or more processors configured similarly to processor(s) 504, and a memory configured similarly to memory 506. Further, each UAV may include instructions stored on the memory that are executable by the one or more processors to perform one or more functions described herein, or to interact with computing device 502 or one or more charging devices 516 to perform these functions. The one or more charging devices 516 may include one or more processors configured similarly to processor(s) 504, and a memory configured similarly to memory 506. Further, each charging device may include instructions stored on the memory that are executable by the one or more processors to perform one or more functions described herein, or to interact with computing device 502 or UAVs to perform these functions.

One or more of the computing device 502, one or more charging devices 516, or a UAV can determine a capacity of a battery of the UAV. The capacity may correspond to a full charge capacity of the UAV or a current charge capacity of the UAV. For example, first UAV 510 may include a current sensing component (e.g., an ammeter) that determines an amount of current received from the battery while powering first UAV 510. First UAV 510, one or more charging devices 516, or computing device 502 may integrate the current output by the battery over time to determine the capacity of the battery. As another example, first UAV 510 may additionally include a voltage sensing component (e.g., a voltmeter) that determines a voltage output by the battery at a given time. First UAV 510, one or more charging devices 516, or computing device 502 may use a concurrent current and voltage measurement of the battery to infer a capacity of the battery based on known characteristics of a type of the battery (e.g., based on specifications of a particular make and model of the battery). In yet another example, one or more charging devices 516 may include a resistance sensing component (e.g., an ohmmeter) and determine an internal resistance of the battery while charging the battery. First UAV 510, one or more charging devices 516, or computing device 502 may use the internal resistance measurement of the battery to infer a capacity of the battery based on known characteristics of a type of the battery (e.g., based on specifications of a particular make and model of the battery). Other ways of determining battery capacities are possible.

Computing device 502 may track and store data measured by the UAVs or by one or more charging devices 516 in order to adaptively assign target charging characteristics for each UAV, to assign UAVs to different classes, to assign flight operations to particular UAVs, or to schedule maintenance or replacement of a particular battery or UAV.

The capacity of the battery may change over a plurality of charge-discharge cycles. Accordingly, computing device 502 may set a common capacity at which to charge batteries (otherwise referred to as a "threshold capacity") in the fleet of UAVs to promote consistent and predictable charging. For example, first UAV 510 may be a newly deployed UAV with a battery that has zero charge-discharge cycles, and may have a full charge capacity (e.g., a capacity of the battery when fully charged) that is equal to a predetermined capacity for a particular battery type. Second UAV 512 may be a previously deployed UAV with a battery having several charge-discharge cycles and a degraded full charge capacity. Based on at least one of the batteries in the fleet having a degraded full charge capacity, computing device 502 may determine a threshold capacity used for adjusting target charge voltage levels at which each UAV is charged.

As noted above, the threshold capacity relates to a target energy level for use in charging each of a plurality of batteries in a fleet of UAVs. The threshold capacity may be determined based on a maximum capacity in the fleet of UAVs. For example, the threshold capacity may correspond to a predetermined percentage of a full charge capacity of a new battery of the battery type. In other examples, second UAV 512 may have a battery with the lowest full charge capacity in the fleet of UAVs, and the threshold capacity may be based on the lowest full charge capacity. In other examples, the threshold capacity may correspond to an average of battery capacities in the fleet. In each of these examples, the threshold capacity is used for charging each battery in the fleet of UAVs. For example, the threshold capacity may be used as a target charge level for each battery in order to balance the capacities of each battery in the fleet. Other ways of determining the threshold capacity are possible.

Computing device 502 may set the threshold capacity for the entire fleet of UAVs, and determine a target charge voltage for each battery in the fleet of UAVs. For example, computing device 502, a UAV, or one or more charging devices 516 may determine a minimum voltage at which a particular battery will reach the threshold capacity, and set the target voltage to be greater than or equal to the minimum voltage. Computing device 502 may instruct one or more charging devices 516 to monitor the charge voltage of first UAV 510, and to stop charging after reaching a charge voltage that corresponds to the threshold capacity. In this manner, each battery in the fleet of UAVs can have an individually determined target charge voltage determined based on a capacity of the battery and based on the threshold capacity. As a battery degrades or the threshold capacity changes, computing device 502 can adjust the target voltage for the battery to meet the threshold capacity. Further details regarding charge voltages and battery capacities are provided below with respect to FIGS. 5 and 6.

Though a capacity of a battery is referred to herein as being used for purposes of setting a target charge voltage of the battery, more generally a State of Health of the battery can be used. For example, a number of charge-discharge cycles of the battery, age of the battery, or other characteristics of the battery may be used for determining a target charge voltage for the battery.

Figure 6:
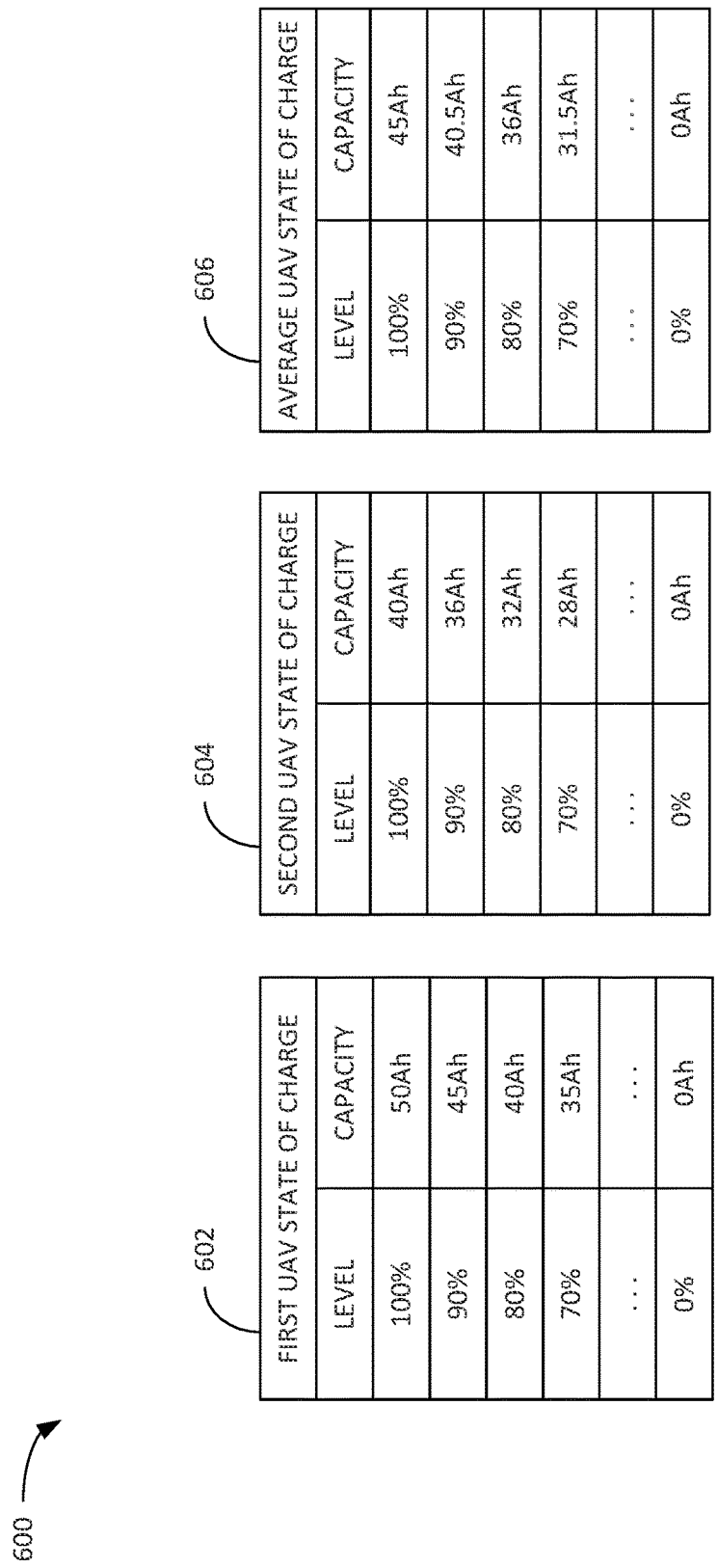
FIG. 6 illustrates state of charge information for a plurality of UAV batteries, in accordance with example embodiments.

FIG. 6 illustrates state of charge information for a plurality of UAV batteries, in accordance with example embodiments. In particular, FIG. 6 shows state of charge information 600 that includes first charge information 602 corresponding to a first UAV, second charge information 604 corresponding to a second UAV, and third charge information corresponding to an average state of charge for a plurality of UAVs.

First charge information 602 shows a range of charge levels corresponding to a first UAV. The charge levels include a full charge level (100%) through a zero charge level (0%). First charge information 602 also shows a range of battery capacities for a first battery of the first UAV. The capacities range from 50 Ah at the full charge level to 0 Ah at the zero charge level. These capacities at various charge levels might correspond to a new battery with zero charge-discharge cycles. A charging device can set a target charge voltage at a level that is less than the full charge voltage to reach a desired capacity for the first battery. For example, in a fleet of UAVs, a desired lifetime of a battery might be achieved by initially charging new batteries to a threshold voltage corresponding to an 80% state of charge of a new battery (e.g., a charge voltage corresponding to 40 Ah).

Second charge information 604 shows a range of charge levels corresponding to a second UAV. The charge levels include a full charge level (100%) through a zero charge level (0%). Second charge information 604 also shows a range of battery capacities for a second battery of the second UAV. The capacities range from 40 Ah at the full charge level to 0 Ah at the zero charge level. This range of battery capacities might correspond to a battery having a degraded full charge capacity due to multiple charge-discharge cycles. Accordingly, a full charge capacity of the second battery of the second UAV is observably less than the full charge capacity of the first battery of the first UAV. A battery management system may take these different capacities into account when setting a threshold capacity for charging the batteries. For example, if the threshold capacity is larger than a full charge capacity of the battery of the second UAV (e.g., greater than 40 Ah), then the second battery might be switched for a new battery, or the second UAV may be designated to a different class of UAVs associated with flight operations requiring less capacity (e.g., delivering payloads within a smaller flight radius).

Third charge information 606 shows a range of charge levels corresponding to averages of a fleet of UAVs. The charge levels include a full charge voltage (100%) through a zero charge voltage (0%). Third charge information 606 also shows a range of battery capacities for an average of batteries in the fleet of UAVs. The capacities range from 45 Ah at the full charge level to 0 Ah at the zero charge level. Within examples, a battery management system may set the capacity threshold as an average capacity of the fleet of aircraft. For example, in a fleet of UAVs, a desired lifetime of a battery might be achieved by initially charging new batteries to a threshold voltage corresponding to an 80% state of charge of an average battery in the fleet (e.g., a charge voltage corresponding to 37 Ah). This may allow batteries that decline more quickly relative to other batteries in the fleet to be phased out of use or replaced, and thus the threshold capacity may serve as a passive indicator to the battery management system that one or more new batteries should be installed within the fleet of UAVs. In other examples, the threshold capacity may be constant (e.g., a percentage of a full charge capacity of a new battery). Other ways of determining the threshold capacity are possible.

As described further with respect to FIGS. 7A and 7B below, a charge voltage can be determined for each UAV that corresponds to meeting or exceeding the threshold capacity. As each battery degrades as it ages, its full charge capacity reduces (e.g., as shown in second charge information 604), and the charge voltage required to reach the threshold capacity when charging increases. Accordingly, it should be understood that the first battery corresponding to first charge information 602 requires a lower charge voltage to reach the threshold capacity (e.g., 40 Ah) than the second battery corresponding to second charge information 604.

Figure 7A:
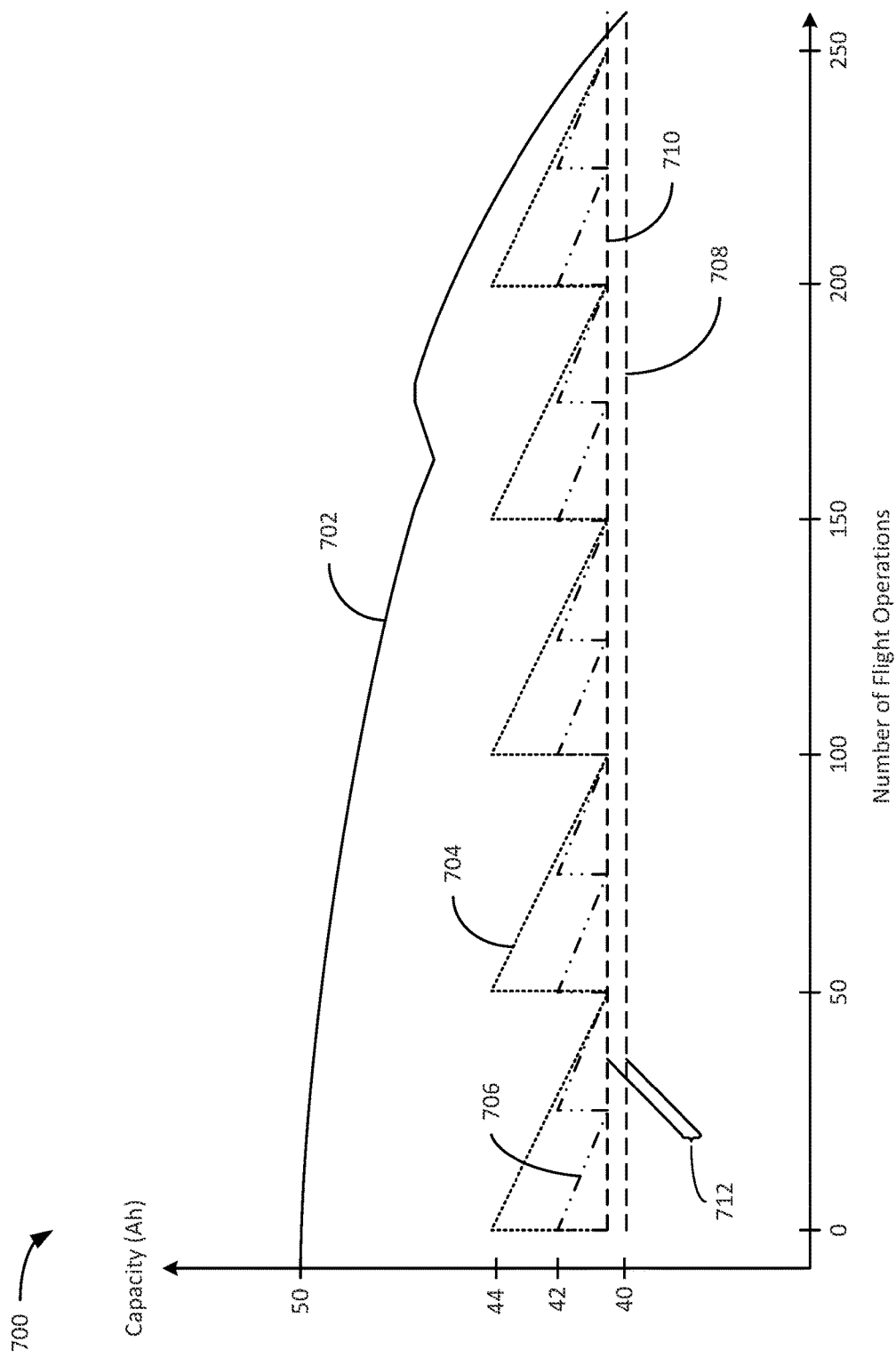
FIG. 7A illustrates battery capacity information over a number of flight operations for a UAV battery, in accordance with example embodiments.

FIG. 7A illustrates battery capacity information over a number of flight operations for a UAV battery, in accordance with example embodiments. In particular, FIG. 7A shows a graph 700 illustrating a full charge capacity 702 of a battery declining with age until the full charge capacity 702 intersects with a threshold capacity 708. For example, the following examples may correspond to part of a lifetime of the first battery described above with respect to FIG. 6. FIG. 7A also shows a first capacity curve 704 illustrating periodically changing a charge voltage of the battery in accordance with a first period (e.g., 50 flight operations), and a second capacity curve 706 illustrating periodically changing a charge voltage of the battery in accordance with a second period (e.g., 25 flight operations). Different types of periods can be used, such as a time period (e.g., 30 days), a period of active use (e.g., 100 flight hours), or some other metric for aging and/or degradation of the battery.

Determining first capacity curve 704 or second capacity curve 706 involves comparing the full charge capacity 702 of the battery to the threshold capacity 708. Determining the full charge capacity 702 can include one or more of coulomb counting under full charge/discharge conditions of the battery or partial charge/discharge conditions of the battery, machine learned models trained using coulomb data and/or internal resistance data, or estimates based on known characteristics of a battery type of the battery and a determined usage level of the battery. Other ways of determining the full charge capacity 702 of the battery are possible. Based on comparing the full charge capacity 702 of the battery to the threshold capacity 708, a computing device (e.g., computing device 502) may set a target charge voltage for the battery (illustrated in FIG. 7B), which corresponds to the charge capacity of the battery. As shown in FIG. 7A, this charge capacity of the battery in both first capacity curve 704 and second capacity curve 706 remains below the full charge capacity 702. The charge capacity is higher than the threshold capacity 708 in order to allow multiple charge/discharge cycles of the battery before readjusting the target charge voltage.

Further, as shown in FIG. 7A, both first capacity curve 704 and second capacity curve 706 remain above a nominal threshold capacity 710, which is separated from the threshold capacity 708 by an error term 712. Error term 712 corresponds to an estimated error in determining the full charge capacity 702 and an estimated error in calculating how quickly the capacity curve approaches the threshold capacity 708 after multiple charge/discharge cycles, and further ensures that first capacity curve 704 or second capacity curve 706 do not fall below the threshold capacity 708 after several charge/discharge cycles. Determining the error term 712 may be based on observed variations in capacity curves from a plurality of batteries. For example, variations between different batteries, different cells in each battery, or in flight operations may result in the error term 712.

In practice, the second capacity curve 706 may extend the lifetime of the battery beyond that of the first capacity curve 704 because the second capacity curve maintains the charge capacity of the battery at a level that is closer to the threshold capacity 708. Determining the full charge capacity 702 more frequently allows for lower charge capacity because the target charge voltage is adjusted more often, as shown in FIG. 7B. Determining the full charge capacity of the battery even more frequently (e.g., after every completed flight operation) can further extend the battery life, though this may involve increases operational burdens. Accordingly, similarly to the threshold capacity 708, how frequently the full charge capacity 702 is determined may be set based on a desired battery lifetime.

Figure 7B:
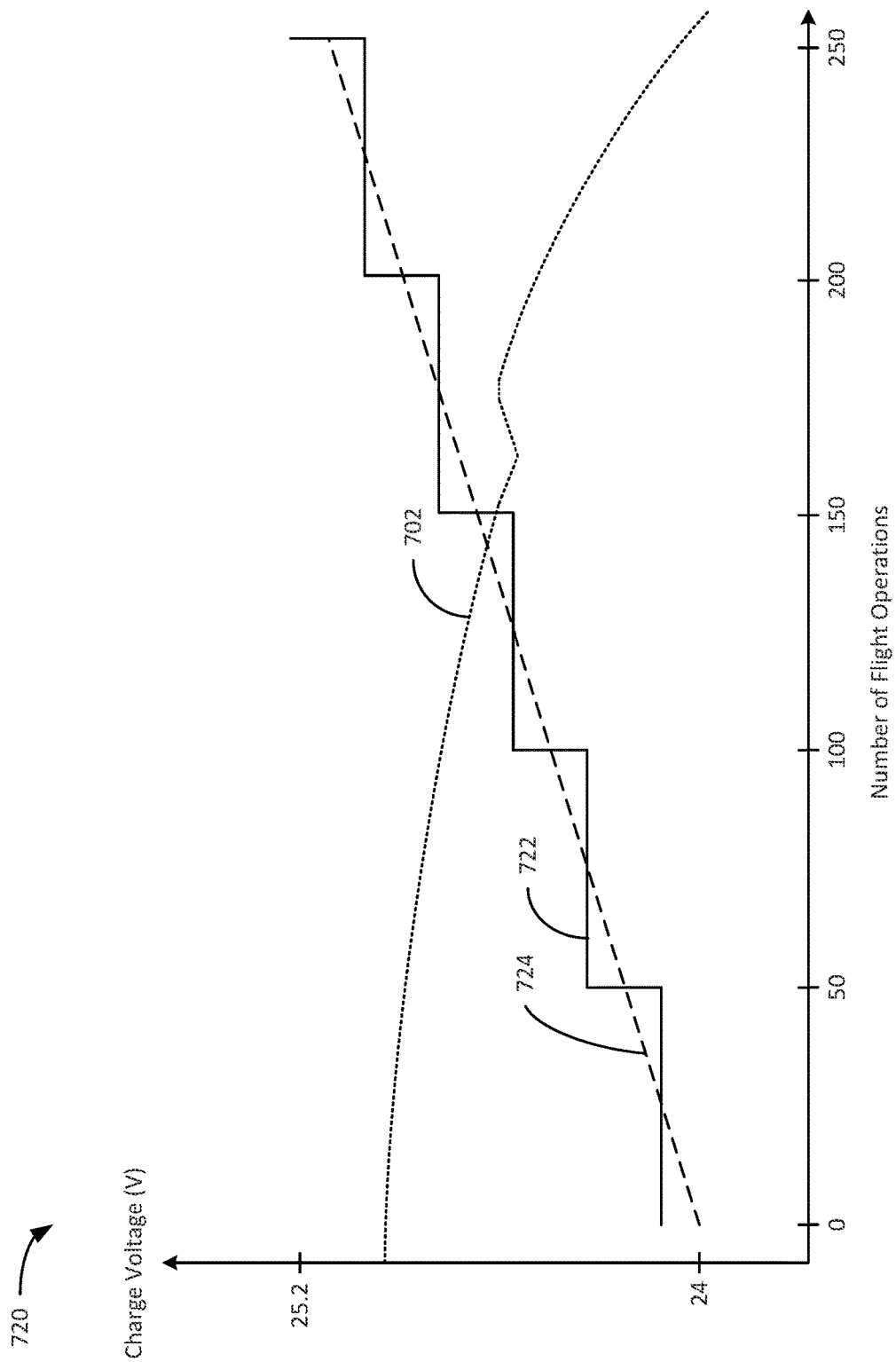
FIG. 7B illustrates charge voltage information over a number of flight operations for a UAV battery, in accordance with example embodiments.

FIG. 7B illustrates charge voltage information over a number of flight operations for a UAV battery, in accordance with example embodiments. In particular, FIG. 7B shows a graph 720 illustrating a first target voltage 722 and a second target voltage 724, which both increase as the battery ages. For example, the following examples may correspond to part of a lifetime of the first battery described above with respect to FIG. 6. For reference purposes, FIG. 7B also shows a representation of the full charge capacity 702 of the battery declining with age as the target voltage increases. As shown in FIG. 7B, first target voltage 722 is periodically changed for charging the battery to match the first capacity curve 704. Second target charge voltage 724 does not match second capacity curve 706, but rather illustrates adjusting the target charge voltage after each flight operation. Though first target voltage 722 and second target voltage 724 are shown to increase at a constant rate, in practice the voltage may increase at an irregular rate. The target voltage can be based on the current full charge capacity of the battery, for example, in accordance with a known discharge curve of a battery type of the battery, or based on observed capacity levels and target charge voltages of multiple batteries that have degraded over time. As shown in FIG. 7B, the battery has a maximum charge voltage of 25.2V, which may correspond to a single battery, or a multi-cell battery. For example, the battery may include six cells, each with a maximum charge voltage of 4.2V. Other configurations of the battery are possible.

Figure 8:
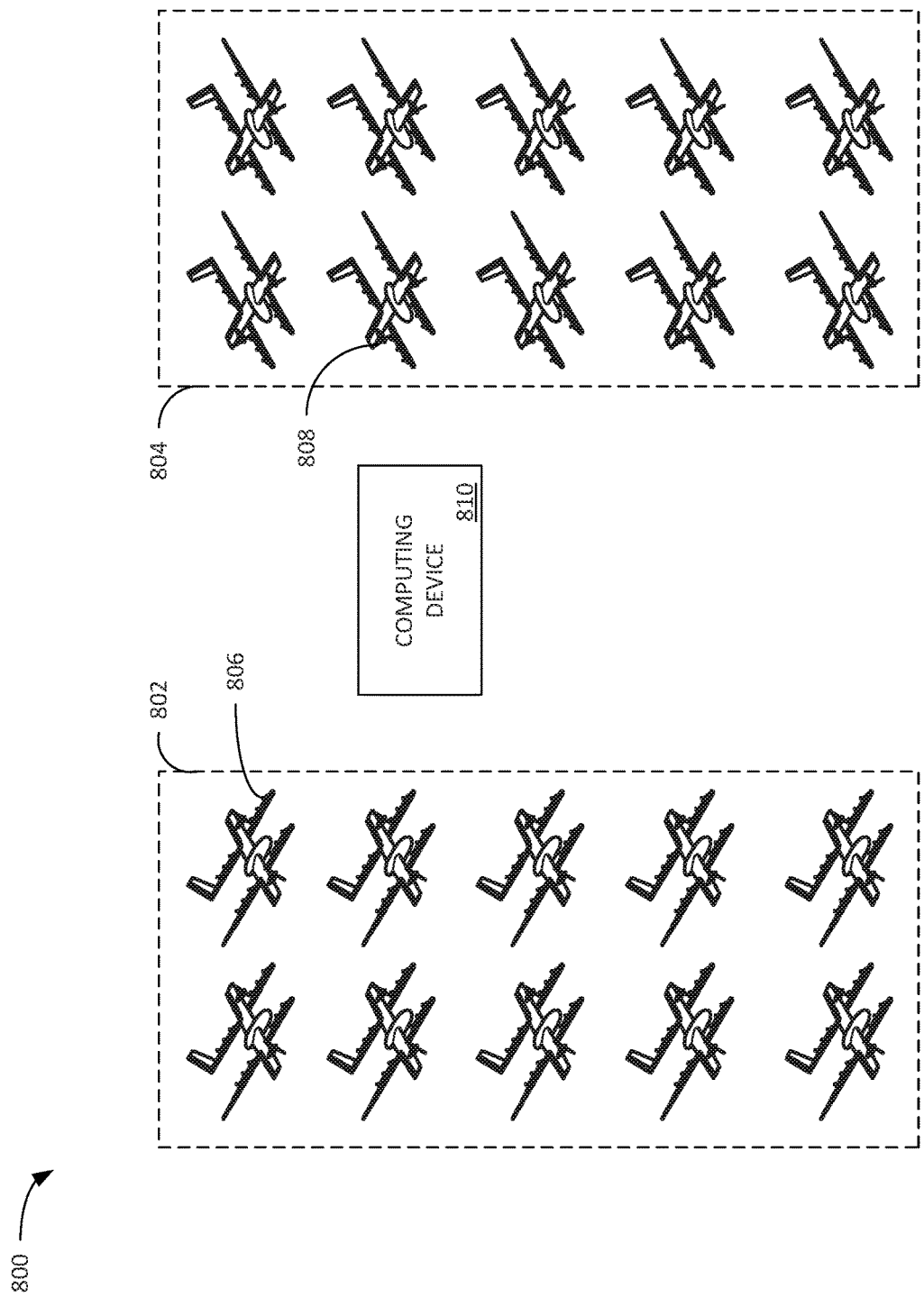
FIG. 8 illustrates a fleet of UAVs, in accordance with example embodiments.

FIG. 8 illustrates a fleet of UAVs, in accordance with example embodiments. In particular, FIG. 8 shows a fleet 800 that includes a first class of UAVs 802 and a second class of UAVs 804. The fleet 800 may operate in a similar manner to that described above with respect to FIG. 4, and may be included at one or more nest locations. First class of UAVs 802 may correspond to a first threshold capacity and second class of UAVs 804 may correspond to a second threshold capacity that is less than the first threshold capacity. The first class of UAVs 802 includes a first UAV 806 having a first battery with a full charge capacity that exceeds the first threshold capacity. The second class of UAVs includes a second UAV 808 having a second battery with a full charge capacity that exceeds the second threshold capacity, but that is less than the first threshold capacity.

Fleet 800 may be controlled by a computing device 810 that operates as a controller of the fleet and as a controller of a battery management system for batteries of fleet 800. Computing device 810 may be configured to determine the first threshold and the second threshold, to track capacities of batteries in fleet 800, and to designate which class each UAV is assigned to based on the tracked battery capacities. Further, computing device 810 may assign flight operations based on a class of UAV. For example, computing device 810 may determine an operation capacity associated with performing a flight operation, determine that the first threshold capacity exceeds the operation capacity, and the second threshold capacity does not exceed the operation capacity, and assign first UAV 806 to the flight operation based on the first threshold capacity exceeding the operation capacity. In this manner, a battery management system controlled by computing device 810 can increase reliability of fleet management by ensuring that any UAV in a class of UAV has enough capacity to perform a given operation.

Figure 9:
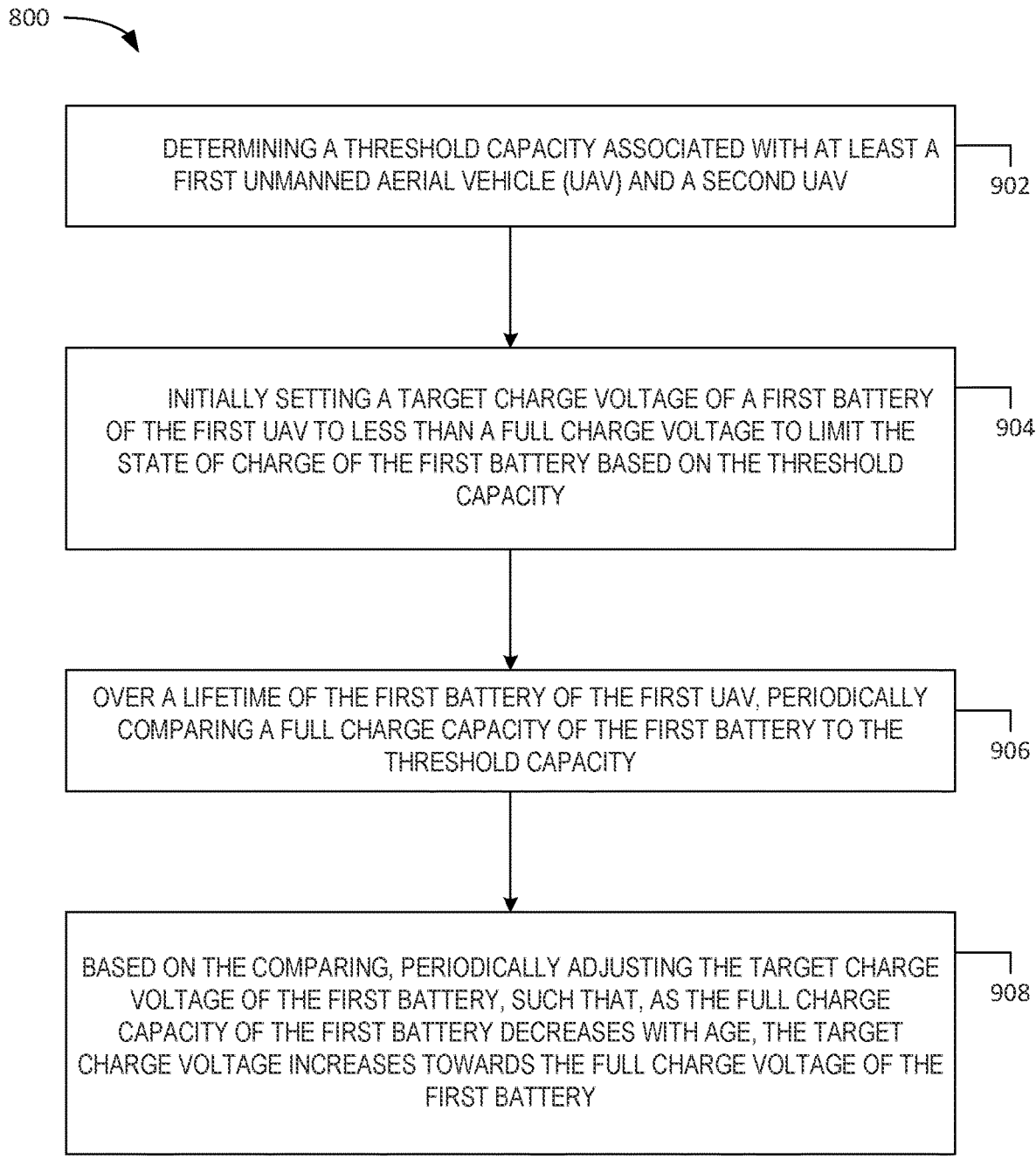
FIG. 9 illustrates a block diagram of a method, in accordance with example embodiments.

FIG. 9 illustrates a block diagram of a method, in accordance with example embodiments. In particular, FIG. 9 shows a method 900. Method 900 may be carried out by any of the systems described above with regard to FIGS. 1-8. For example, method 900 may be carried out by a battery management system configured to coordinate battery charging operations within a fleet of UAVs.

In addition, for the method shown in FIG. 9 and other processes and methods disclosed herein, the flowchart shows functionality and operation of one possible implementation of present embodiments. In this regard, some blocks may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include a non-transitory computer readable medium, for example, such as computer readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, a tangible storage device, or other article of manufacture, for example.

In addition, for the method and other processes and methods disclosed herein, each block in FIG. 9 may represent circuitry that is wired to perform the specific logical functions in the process.

At block 902, method 900 includes determining a threshold capacity associated with at least a first unmanned aerial vehicle (UAV) and a second UAV. The threshold capacity may be determined as a percentage of a full charge capacity of a type of battery used by the fleet, may be determined relative to an average full charge capacity of UAVs in the fleet of UAVs, or may be determined based on a capacity required to perform an operation for the fleet (e.g., a payload delivery within a maximum flight radius from the fleet). Other ways of determining the threshold capacity are possible.

At block 904 method 900 includes initially setting a target charge voltage of a first battery of the first UAV to less than a full charge voltage to limit the state of charge of the first battery based on the threshold capacity. For example, the target charge voltage may correspond to an estimated number of charge/discharge cycles of the first battery before adjusting the target charge voltage. In general, the target charge voltage corresponds to a charging the first battery to a level above the threshold capacity, as shown in FIG. 7A.

At block 906, method 900 includes over a lifetime of the first battery of the first UAV, periodically comparing a full charge capacity of the first battery to the threshold capacity. For example, this may be performed after a threshold number of flight operations have been performed since last adjusting the target charge voltage, after a threshold time has elapsed since last adjusting the target charge voltage, or after a threshold number of flight hours of the first UAV since last adjusting the target charge voltage.

At block 908, method 900 includes, based on the comparing, periodically adjusting the target charge voltage of the first battery, such that, as the full charge capacity of the first battery decreases with age, the target charge voltage increases towards the full charge voltage of the first battery. For example, this may be performed in accordance with FIG. 7B and the corresponding description thereof.

Within examples, determining the threshold capacity comprises determining the threshold capacity based on capacities of at least two other batteries of at least two other UAVs. For example, the threshold capacity may be determined based on a percentage of an average capacity of batteries of a fleet of UAVs, or may be determined based on determining a minimum capacity for a plurality of batteries of the fleet of UAVs.

Within examples, determining the threshold capacity comprises determining the threshold capacity based on a maximum flight radius of the first UAV and the second UAV. For example, a fleet of UAVs may operate within a predetermined area, and a maximum flight radius may be used to determine a maximum flight path distance that requires at least the threshold capacity.

Within examples, the threshold capacity corresponds to a full charge capacity shared by a plurality of UAVs. For example, the full charge capacity may be a full charge capacity specified for a type of battery common to a fleet of UAVs. The threshold capacity may be represented as a percentage of a full charge capacity of a new battery of the type of battery.

Within examples, the determining the threshold capacity includes determining a desired average lifetime of a plurality of batteries in a fleet of UAVs (e.g., a lifetime corresponding to a threshold number of flight operations, determining a battery capacity associated with reaching the desired average lifetime, and setting the battery capacity associated with reaching the desired average lifetime as the threshold capacity. Determining the battery capacity associated with reaching the desired average lifetime may include determining the battery capacity based on capacity data from a plurality of UAV batteries over time. In these examples, determining the battery capacity associated with reaching the desired average lifetime can be based on one or more battery degradation characteristics of a particular battery type. For example, the particular battery type can be a lithium-ion battery type, and the one or more battery degradation characteristics can include one or more of internal resistance rise, loss of balance, and self-discharge-rate of the lithium-ion battery type. These characteristics can be used to estimate capacity loss without directly measuring battery capacities, though doing so might be less precise than performing an actual measurement. Accordingly, an error term may be used when determining a corresponding target charge voltage levels to account for possible inaccuracy of the determined battery capacity. Further, an estimated battery capacity determined using one or more battery degradation characteristics might be performed between more accurate measurements to ensure adequate charge levels in the battery.

Within examples, initially setting the target charge voltage of the first battery of the first UAV to less than the full charge voltage includes setting the target charge voltage as a less-than-full charge voltage of a new battery. For example, this may be performed as described with respect to FIG. 7B.

Within examples, initially setting the target charge voltage of the first battery of the first UAV to less than the full charge voltage includes setting the target charge voltage as a charge voltage corresponding to a battery capacity that is greater than the threshold capacity by at least an error term associated with measuring the full charge capacity of the first battery. For example, this may be performed as described with respect to FIGS. 7A and 7B.

Within examples, the initial target charge voltage of the first battery is different from a current target charge voltage of a second battery of the second UAV. For example, the first battery and the second battery may have different capacities, and the target charge voltages may be determined based on the determined capacities.

Within examples, periodically comparing the full charge capacity of the first battery to the threshold capacity includes periodically determining that the first UAV has completed a flight operation, and determining the full charge capacity of the first battery responsive to determining that the first UAV has completed the flight operation. In other examples, periodically comparing the full charge capacity of the first battery to the threshold capacity includes determining the full charge capacity of the first battery after the first UAV has completed a predetermined number of flight operations since last determining the full charge capacity. For example, this may be performed as described with respect to FIGS. 7A and 7B.

Within examples, method 900 further includes determining a minimum battery capacity within a fleet of UAVs including the first UAV and the second UAV, and determining the threshold capacity based on the minimum battery capacity within the fleet of UAVs.

Within examples, method 900 further includes determining a plurality of classes of UAVs in a fleet of UAVs. A first class corresponds to a first threshold capacity, and a second class corresponds to a second threshold capacity that is less than the first threshold capacity. Method 900 may further include initiating a flight operation for performance by a UAV in the fleet of UAVs, determining that the first class of UAV corresponds to a threshold capacity capable of performing the flight operation, and assigning the first UAV to the flight operation based on the UAV being in the first class of UAV. In this manner, a controller of the fleet of UAVs may quickly and consistently determine a UAV to assign to an operation based on which class of UAVs the UAV belongs. In these examples, method 900 may further include assigning the first UAV to the first class based on the first capacity of the first battery. Method 900 may additionally or alternatively include assigning the first UAV to the first class based on a state of health of the first battery.

Within examples, method 900 further includes determining a nominal charge voltage that maintains at least the threshold battery capacity for the first battery for at least a threshold number of charge cycles (e.g. 50 charge cycles). In these examples, adjusting the target charge voltage includes adjusting the target charge voltage to the nominal target charge voltage.

Within examples, method 900 further includes determining a common target charge voltage for a plurality of UAVs that maintains at least the threshold battery capacity for a threshold number of charge cycles. For example, the target charge voltage may be set to a level corresponding to a capacity above the threshold capacity such that several charge cycles of the UAVs can reliably be applied without adjusting the target charge voltage. In these examples, adjusting a first target charge voltage of the first battery includes adjusting the first target charge voltage to the common target charge voltage.

Within examples, determining the threshold capacity associated with at least the first UAV and the second UAV includes determining a threshold battery capacity for a plurality of UAVs including the first UAV and the second UAV. Determining the threshold battery capacity for the plurality of UAVs includes determining the threshold battery capacity based on each of the plurality of UAVs being able to execute a same flight operation. For example, the same flight operation may correspond to a common flight radius or flight path executed by a fleet of UAVs.

Within examples, the first UAV and the second UAV are part of a plurality of UAVs. In these examples, method 900 may further include initially setting a target charge voltage for each battery in the fleet of UAVs at the same target charge voltage, over a lifetime of each battery of the plurality of UAVs, periodically comparing a full charge capacity of the battery to the threshold capacity, and, based on the comparing, periodically adjusting the target charge voltage of each battery, such that, as the full charge capacity of each battery decreases with age, the target charge voltage increases towards the full charge voltage of the battery. In this manner, a system can manage batteries across the fleet of UAVs in a consistent manner, while also taking into account unique degradation characteristics of each battery, such as internal resistance rise, loss of balance, and self-discharge-rate.

Other functionality described above with respect to FIGS. 1-8 can be included within method 900 as well.

VII. CONCLUSION

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The above detailed description describes various features and functions of the disclosed systems, devices, and methods with reference to the accompanying figures. In the figures, similar symbols typically identify similar components, unless context dictates otherwise. The example embodiments described herein and in the figures are not meant to be limiting. Other embodiments can be utilized, and other changes can be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

A block that represents a processing of information may correspond to circuitry that can be configured to perform the specific logical functions of a herein-described method or technique. Alternatively or additionally, a block that represents a processing of information may correspond to a module, a segment, or a portion of program code (including related data). The program code may include one or more instructions executable by a processor for implementing specific logical functions or actions in the method or technique. The program code or related data may be stored on any type of computer readable medium such as a storage device including a disk or hard drive or other storage medium.

The computer readable medium may also include non-transitory computer readable media such as computer-readable media that stores data for short periods of time like register memory, processor cache, and random access memory (RAM). The computer readable media may also include non-transitory computer readable media that stores program code or data for longer periods of time, such as secondary or persistent long term storage, like read only memory (ROM), optical or magnetic disks, compact-disc read only memory (CD-ROM), for example. The computer readable media may also be any other volatile or non-volatile storage systems. A computer readable medium may be considered a computer readable storage medium, for example, or a tangible storage device.

Moreover, a block that represents one or more information transmissions may correspond to information transmissions between software or hardware modules in the same physical device. However, other information transmissions may be between software modules or hardware modules in different physical devices.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. A method, comprising:
    determining a threshold capacity associated with a vehicle;
    setting a target charge voltage of a battery of the vehicle to an initial target charge voltage that is less than a full charge voltage to limit a state of charge of the battery based on the threshold capacity;
    comparing a full charge capacity of the battery to the threshold capacity; and
    based on comparing the full charge capacity of the battery to the threshold capacity, increasing the target charge voltage of the battery from the initial target charge voltage to an adjusted target charge voltage that is greater than the initial target charge voltage and less than the full charge voltage of the battery.

2. The method of claim 1, wherein the threshold capacity is shared by a plurality of vehicles that comprises the vehicle, and wherein determining the threshold capacity comprises:
    determining, for each respective vehicle of the plurality of vehicles, a corresponding capacity of a corresponding battery of the respective vehicle; and
    determining the threshold capacity based on the corresponding capacity of the corresponding battery of each respective vehicle of the plurality of vehicles.

3. The method of claim 1, wherein determining the threshold capacity comprises:
    determining a target travel distance shared by a plurality of vehicles each configured to execute a same flight operation, wherein the plurality of vehicles comprises the vehicle; and
    determining the threshold capacity based on the target travel distance.

4. The method of claim 1, wherein determining the threshold capacity comprises:
    determining a desired average lifetime of a plurality of batteries of a plurality of vehicles that includes the vehicle; and
    determining the threshold capacity based on the desired average lifetime.

5. The method of claim 1, wherein determining the threshold capacity comprises:
    determining a battery degradation characteristic of a particular battery type used by the vehicle; and
    determining the threshold capacity based on the battery degradation characteristic.

6. The method of claim 5, wherein the particular battery type is a lithium-ion battery type, and wherein the battery degradation characteristic comprises one or more of: internal resistance rise, loss of balance, or self-discharge rate.

7. The method of claim 1, wherein the full charge voltage represents a full state of charge of the battery in a new state, wherein the battery of the vehicle has been used for at least a threshold number of cycles, and wherein, due to the battery of the vehicle having been used, the initial target charge voltage corresponds to a lower capacity of the battery than a capacity that would be reached at the initial target charge voltage by the battery in the new state.

8. The method of claim 1, wherein the initial target charge voltage corresponds to a battery capacity that is greater than the threshold capacity by at least an error term associated with measuring the full charge capacity of the battery.

9. The method of claim 1, wherein the threshold capacity is also associated with a second vehicle, and wherein the initial target charge voltage of the battery is different from a current target charge voltage of a second battery of the second vehicle.

10. The method of claim 1, wherein:
    comparing the full charge capacity of the battery to the threshold capacity comprises repeatedly comparing the full charge capacity of the battery to the threshold capacity, and
    increasing the target charge voltage of the battery comprises repeatedly increasing the target charge voltage such that, as the battery degrades over time, the target charge voltage increases towards the full charge voltage of the battery.

11. The method of claim 1, wherein comparing the full charge capacity of the battery to the threshold capacity comprises:
    determining that the vehicle has completed a transport task; and
    determining the full charge capacity of the battery based on determining that the vehicle has completed the transport task.

12. The method of claim 1, wherein comparing the full charge capacity of the battery to the threshold capacity comprises:
    determining the full charge capacity of the battery after the vehicle has completed a predetermined number of flight operations since previously determining the full charge capacity.

13. The method of claim 1, further comprising:
    determining a plurality of classes of vehicles in a fleet of vehicles, wherein a first class of the plurality of classes of vehicles corresponds to a first threshold capacity, and wherein a second class of the plurality of classes of vehicles corresponds to a second threshold capacity that is different from the first threshold capacity.

14. The method of claim 13, further comprising:
    determining a transport task;
    determining that the first threshold capacity is sufficient for performing the transport task; and
    assigning the vehicle to the transport task based on the vehicle belonging to the first class.

15. The method of claim 13, further comprising:
    assigning the vehicle to the first class based on the full charge capacity of the battery being greater than the first threshold capacity.

16. The method of claim 1, further comprising:
    determining a nominal charge voltage that maintains at least the threshold capacity for the battery for at least a threshold number of charge cycles, wherein increasing the target charge voltage comprises adjusting the target charge voltage based on the nominal charge voltage.

17. The method of claim 1, wherein the vehicle is part of a fleet of vehicles, and wherein the method further comprises:
    setting a corresponding target charge voltage of each respective battery in the fleet of vehicles at a corresponding initial target charge voltage;

comparing, for each respective battery in the fleet of vehicles, a corresponding full charge capacity of the respective battery to the threshold capacity; and based on the comparing of the corresponding full charge capacity of the respective battery to the threshold capacity, increasing the corresponding target charge voltage of each respective battery from the corresponding initial target charge voltage to a corresponding adjusted target charge voltage that is greater than the corresponding initial target charge voltage and less than a corresponding full charge voltage of the respective battery.

18. The method of claim 1, wherein the vehicle comprises an unmanned aerial vehicle.

19. A system comprising:

a processor; and a non-transitory computer-readable storage medium having stored thereon instructions that, when executed by the processor, cause the processor to perform operations comprising:

determining a threshold capacity associated with a vehicle;

setting a target charge voltage of a battery of the vehicle to an initial target charge voltage that is less than a full charge voltage to limit a state of charge of the battery based on the threshold capacity;

comparing a full charge capacity of the battery to the threshold capacity; and based on comparing the full charge capacity of the battery to the threshold capacity, increasing the target charge voltage of the battery from the initial target charge voltage to an adjusted target charge voltage that is greater than the initial target charge voltage and less than the full charge voltage of the battery.

20. A non-transitory computer-readable storage medium having stored thereon instructions that, when executed by a computing system, cause the computing system to perform operations comprising:

determining a threshold capacity associated with a vehicle;

setting a target charge voltage of a battery of the vehicle to an initial target charge voltage that is less than a full charge voltage to limit a state of charge of the battery based on the threshold capacity;

comparing a full charge capacity of the battery to the threshold capacity; and based on comparing the full charge capacity of the battery to the threshold capacity, increasing the target charge voltage of the battery from the initial target charge voltage to an adjusted target charge voltage that is greater than the initial target charge voltage and less than the full charge voltage of the battery.

* * * * *